(12) United States Patent
Bachelder et al.

(10) Patent No.: US 6,275,051 B1
(45) Date of Patent: Aug. 14, 2001

(54) SEGMENTED ARCHITECTURE FOR WAFER TEST AND BURN-IN

(75) Inventors: Thomas W. Bachelder, Swanton, VT (US); Dennis R. Barringer, Walkill, NY (US); Dennis R. Conti, Essex Junction, VT (US); James M. Crafts, Warren, VT (US); David L. Gardell, Fairfax, VT (US); Paul M. Gaschke, Wappingers Falls, NY (US); Mark R. Laforce, Essex Junction, VT (US); Charles H. Perry; Roger R. Schmidt, both of Poughkeepsie, NY (US); Joseph J. Van Horn, Underhill, VT (US); Wade H. White, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/240,121

(22) Filed: Jan. 29, 1999

Related U.S. Application Data

(63) Continuation-in-part of application No. 08/998,913, filed on Dec. 29, 1997, now abandoned.

(51) Int. Cl.[7] ............................. G01R 1/073; G01R 31/28
(52) U.S. Cl. ............................................ 324/754; 324/765
(58) Field of Search .................................... 324/754, 757, 324/758, 760, 765

(56) References Cited

U.S. PATENT DOCUMENTS

| | | | |
|---|---|---|---|
| 4,783,719 | * 11/1988 | Jamison et al. | 324/765 |
| 5,497,079 | * 3/1996 | Yamada et al. | 324/754 |
| 5,570,032 | 10/1996 | Atkins et al. | 324/760 |
| 5,945,834 | * 8/1999 | Nakata et al. | 324/754 |
| 5,966,021 | * 10/1999 | Eliashberg et al. | 324/760 |

FOREIGN PATENT DOCUMENTS

| | | |
|---|---|---|
| 07050325 | 2/1995 | (JP) . |
| 07066252 | 3/1995 | (JP) . |
| 07201935 A | 8/1995 | (JP) . |

* cited by examiner

*Primary Examiner*—Ernest Karlsen
(74) *Attorney, Agent, or Firm*—William N. Hogg; Robert A. Walsh

(57) ABSTRACT

An apparatus for simultaneously testing or burning in a large number of the integrated circuit chips on a product wafer includes probes mounted on a first board and tester chips mounted on a second board, there being electrical connectors connecting the two boards. The tester chips are for distributing power to the product chips or for testing the product chips. The probes and thin film wiring to which they are attached are personalized for the pad footprint of the particular wafer being probed. The base of the first board and the second board both remain the same for all wafers in a product family. The use of two boards provides that the tester chip is kept at a substantially lower temperature than the product chips during burning to extend the lifetime of tester chips. A gap can be used as thermal insulation between the boards, and the gap sealed and evacuated for further thermal insulation. Evacuation also provides atmospheric pressure augmentation of contact for connection between boards and contact to wafer. Probes for parallel testing of chips are arranged in crescent shaped stripes to significantly increase tester throughput as compared with probes arranged in an area array.

27 Claims, 27 Drawing Sheets

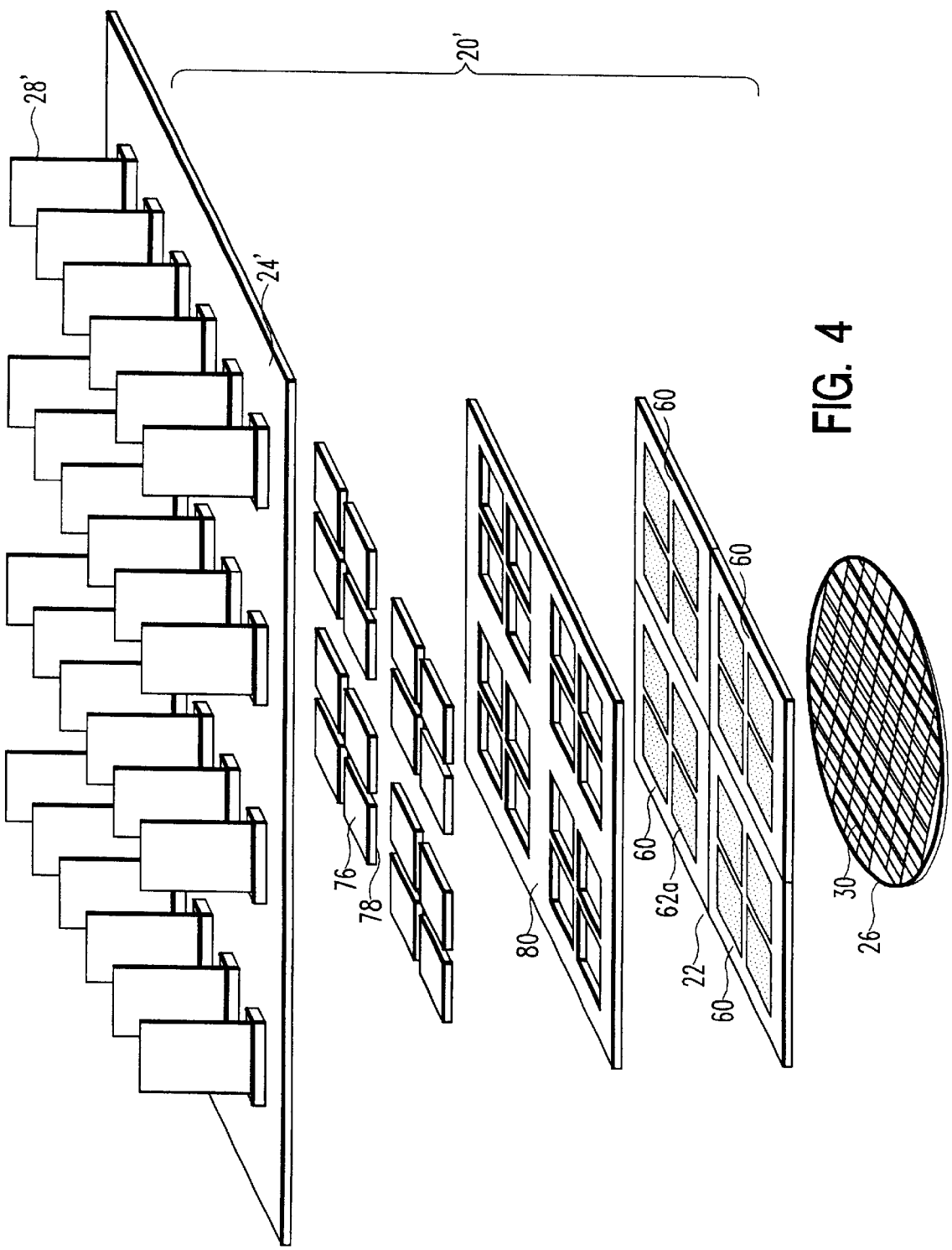

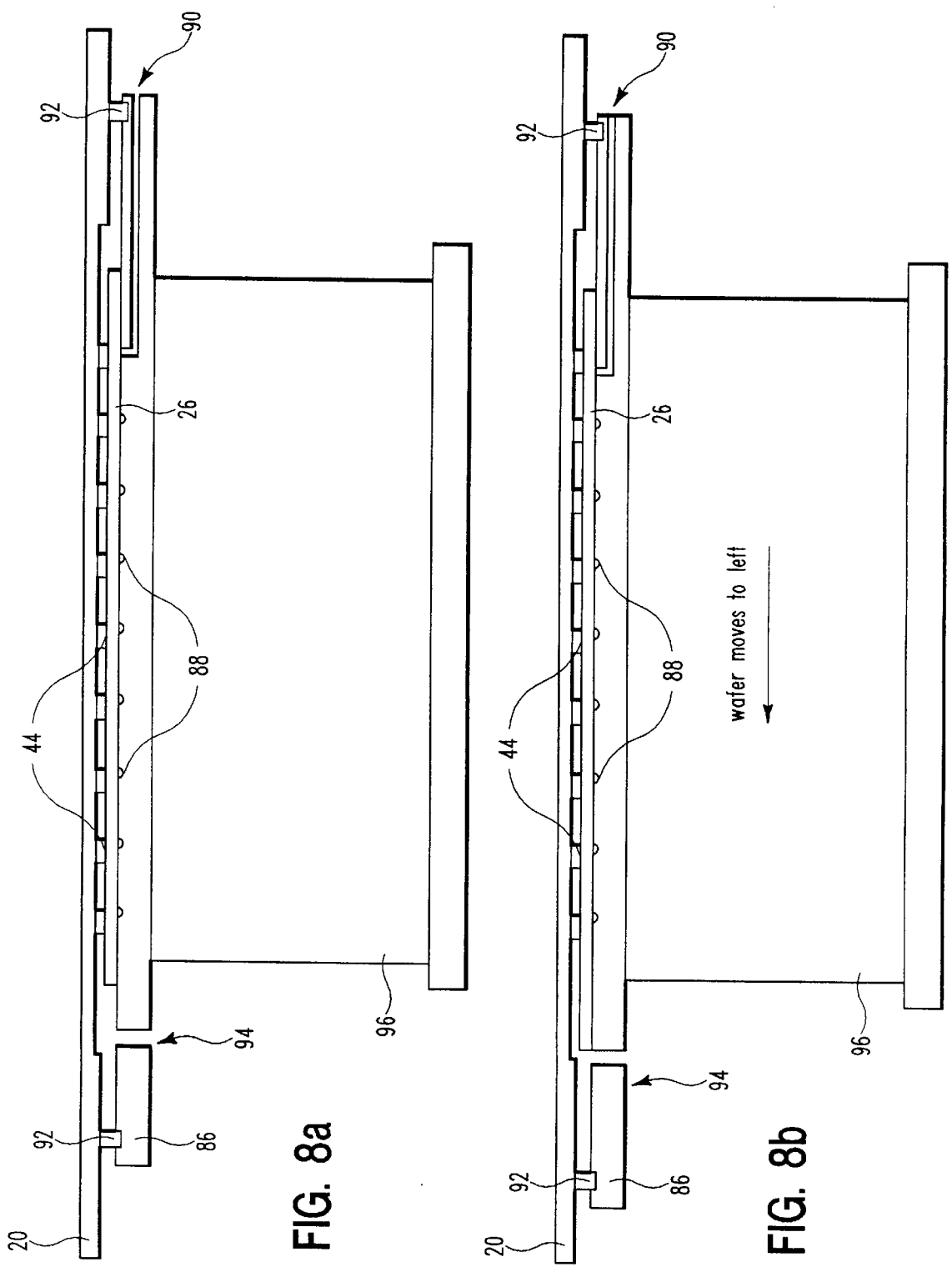

SEGMENTED ARCHITECTURE FOR WAFER TEST AND BURN-IN

RELATED APPLICATIONS

This application is a continuation-in-part of commonly assigned U.S. patent application Ser. No. 08/998,913, filed Dec. 29 1997 now abandoned.

FIELD OF THE INVENTION

This invention generally relates to apparatus for testing integrated circuits. More particularly it relates to arrangements for testing or burning-in integrated circuits at the wafer level. More particularly, it relates to a dual board tester interface having a generic tester chip board spatially separated from but electrically connected to a personalized wafer contacting board.

BACKGROUND OF THE INVENTION

The desirability of testing and burning-in integrated circuits at the wafer level is of particular interest since determination of failures at this early stage can significantly reduce costs. Wafer burn-in is an attractive technique for providing known good die for packaging in semiconductor modules including a large number of chips.

Commonly assigned U.S. Pat. No. 5,600,257, to J. Leas, et al. (the "'257 patent"), discloses an arrangement for simultaneously testing or simultaneously burning-in all the product chips on an integrated circuit wafer. The arrangement provides thermal matching between a test head and the semiconductor wafer, large scale power distribution, and electronic means to remove shorted product chips from the power distribution structure. In one embodiment the test head comprises a glass ceramic substrate, a material closely thermally matched to silicon, with test chips on one side and probes on the other side. The glass ceramic substrate has a sufficient number of thick copper power planes to provide current to each product chip on an integrated circuit wafer with a minimal voltage drop. The test chips have voltage regulators to provide a tightly controlled Vdd and ground voltage to each chip on the product wafer that is substantially independent of the current drawn by that chip and its neighbors, and substantially independent of the presence of shorted chips on the product wafer. The regulators can also be used to disconnect power to shorted chips.

Commonly assigned U.S. patent application Ser. No. 08/882,989, now U.S. Pat. No. 6,020,750, provides an improved arrangement in which a plurality of glass ceramic substrates are tiled together to provide a large area test head.

However, both of these arrangements provide tester chips in such close proximity to the product wafer that the tester chips operate at about the same temperature as the wafer during burn-in, limiting the lifetime of the tester chips. In addition, both of these arrangements for contacting all the chips on a wafer involve expensive hardware, and neither permits contact to a range of chip types that have different contact footprints.

For example, when improved technology permits a chip design to go through a "shrink," decreasing its size and increasing the number of chips that can be fabricated on a wafer, it should not be necessary to redesign an entire test head to accommodate the increased number of chips and the new chip footprint. Thus a better solution is needed that both provides for improved tester chip lifetime and greater flexibility and lower cost for personalizing contacts, and this solution is provided by the following invention.

SUMMARY OF THE INVENTION

It is therefore an object of the present invention to provide an improved test arrangement for simultaneously testing and burning-in a plurality of the product chips on an integrated circuit wafer simultaneously.

It is still another object of the present invention to provide a means of maintaining the product wafer at a burn-in temperature while maintaining tester chips at a significantly lower temperature.

It is a feature of the present invention to provide a test head having at least two boards, one thermally matched and personalized for connection to the wafer under test, the other having test chips mounted thereon there being means for connection and thermal insulation between the two carriers to provide a temperature differential there between.

It is a feature of the present invention that wafers with different chip footprints within a family of memory or logic wafers are tested with the same tester chip board but different personalized boards.

It is a feature of the present invention that a board is formed of tiled glass ceramic portions, that all individual tiles are identical, and that the individual tiles are rotated with respect to each other.

It is a feature of the present invention that thin film wiring is used on the personalized board to personalize it for connection to a product wafer.

It is a feature of the present invention that an interposer is used between the two boards to space transform wiring and provide connection there between.

These and other objects, features, and advantages of the invention are accomplished by a test head, comprising a first board and a second board. The first board has a probe side and a connection side, the probe side having probes for contacting at least one die on a product wafer, the connection side being adapted for electrical connections to the second board. The second board having a contact side and a tester chip side, the contact side has contacts for electrical connection to the connection side of the first board, the tester chip side has a tester chip for distributing power to the die or for testing the die.

BRIEF DESCRIPTION OF THE DRAWINGS

FIG. 1b is a cross sectional view of the parts of the test head shown in FIG. 1a;

FIG. 4 is an exploded perspective view of a test head of an alternate embodiment of the present invention in which a carrier board is formed of standard PC board material and populated with daughter cards;

FIGS. 8a–8b show the contacting of a product wafer with the stepping of the product wafer using the test head FIGS. 7a–7b while providing atmospheric pressure augmentation of the force connecting the vacuum chuck holding the product wafer to the test head and separate vacuum connection of the product wafer to the chuck;

DESCRIPTION OF THE INVENTION

The present invention substantially improves upon U.S. Pat. No. 5,600,257 (the '257 patent), incorporated herein by reference and patent application Ser. No. 08/882,989, now U.S. Pat. No. 6,020,750, incorporated herein by reference, by providing a way to insulate tester chips from the product wafer so that the tester chips can operate at a significantly lower temperature than the wafer during burn-in despite their close proximity. It also provides improved contacting flexibility, providing a rapid and low-cost method to contact, test and burn-in chips having substantially different contact footprints. It also provides means to provide and maintain contact to substantially all the product chips on a very large wafer without contact degradation as temperature varies.

The invention can be used for testing and burning-in a single chip but it is most suitable for contacting testing or burning-in a large number of product chips that are integral with a wafer such as a quarter of the chips, or a majority, and especially for contacting all, or substantially all of the product chips on a product wafer simultaneously.

Figure 1A:
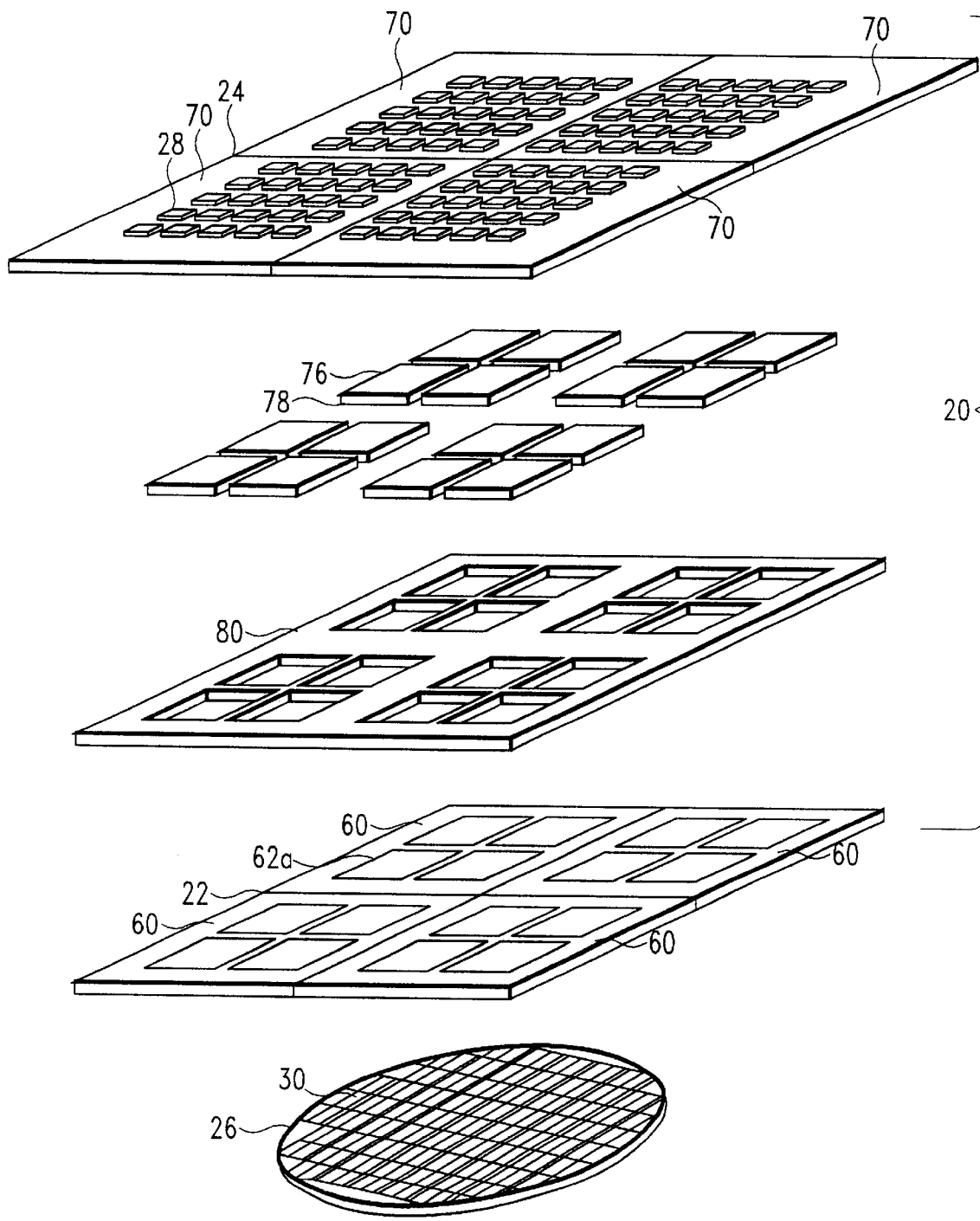
FIG. 1a is an exploded perspective view of a test head of the present invention and a wafer positioned for testing.

In this application words, such as "top" or "top surface," "bottom" or "bottom surface," "over," "under," and "on," are defined with respect to a test head being positioned over a product wafer to be tested, as shown in FIG. 1a, regardless of the orientation the test head and wafer are actually held. A layer is on another layer even if there are intervening layers.

Figure 1B:
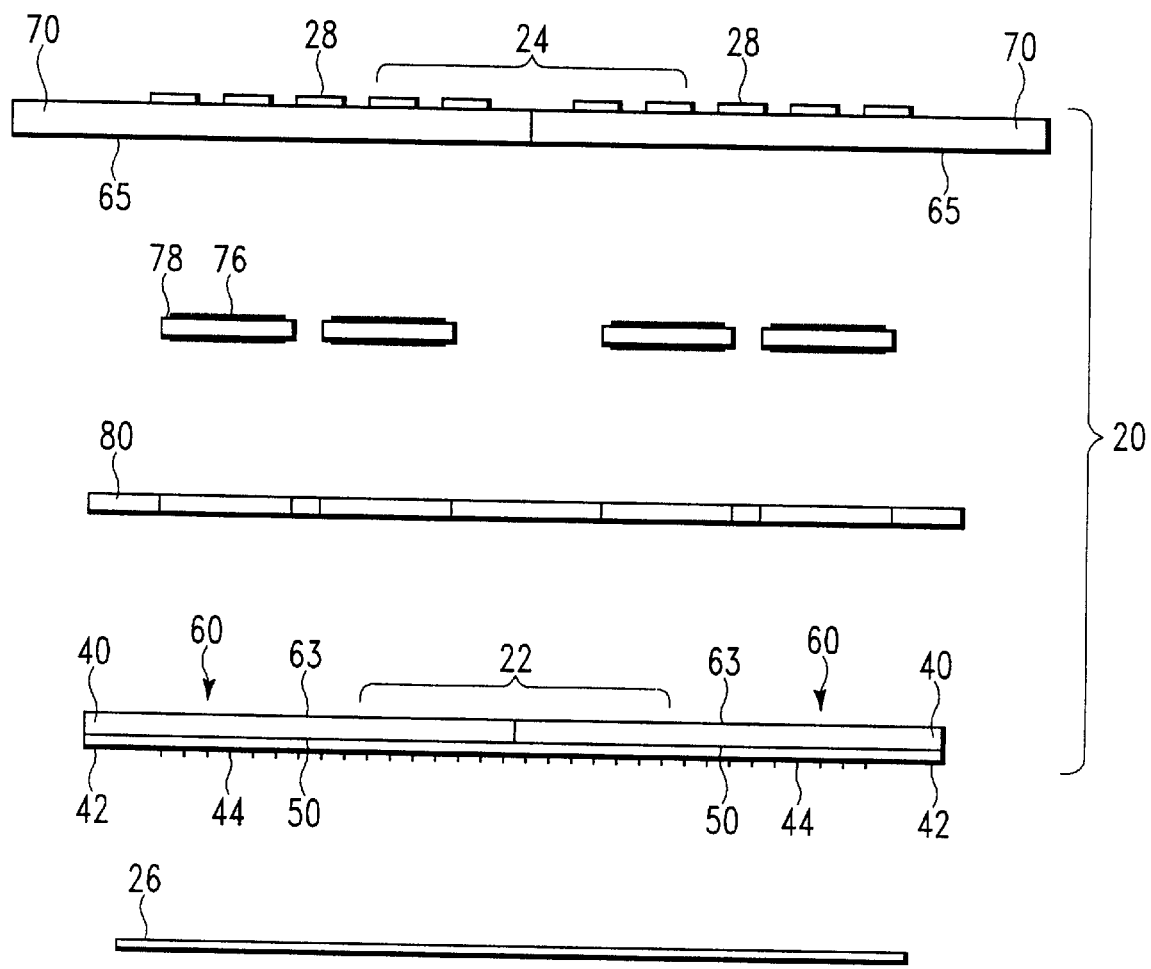

In one embodiment, illustrated in FIGS. 1a–1b, test head 20 is formed of two separated test boards, personalization board 22 and carrier board 24. Personalization board 22 is used for contacting product wafer 26 while carrier board 24 is used for holding individual tester chips 28 that are used for providing regulated power and test signals to product chips 30 on wafer 26. Both personalization board 22 and carrier board 24 are multi layer boards having 3-dimensional wiring. Preferably, personalization board 22 and carrier board 24 are about the same size. Each board has contacts on facing surfaces for connection to each other, and each board has contacts on opposite surfaces for connection either to product chips 30 on product wafer 26 or to tester chips 28.

As described in the '257 patent, personalization board 22 is formed of a material having a thermal coefficient of expansion matching that of the wafer to be tested. Ceramic materials such as glass ceramic or aluminum nitride are suitable. Glass ceramic is preferred and is described in commonly assigned U.S. Pat. No. 4,301,324, to A. H. Kumar, incorporated herein by reference. Glass ceramic has many layers of thick copper conductor so as to carry the large currents needed for wafer test and burn-in with minimum voltage drops.

Personalization board 22 can also be formed from an insulated metal having a low TCE or a laminated metal with alternate layers of polymer and low TCE metal. Low TCE metals include metal alloys, such as Invar or Kovar, and elemental metals, such as tungsten or molybdenum. Laminated metal is described in commonly assigned U.S. Pat. No. 5,224,265 to Dux et al., incorporated herein by reference, and in commonly assigned U.S. Pat. No. 5,128,008 to Chen et al., incorporated herein by reference. If current required is not too great and can be accommodated in thin film layers, personalization board 22 can also be formed of the same material as product wafer 26, typically silicon. In this case feed throughs must be formed between the facing surfaces to provide isolated contact between product wafer and tester chips.

Figure 2A:
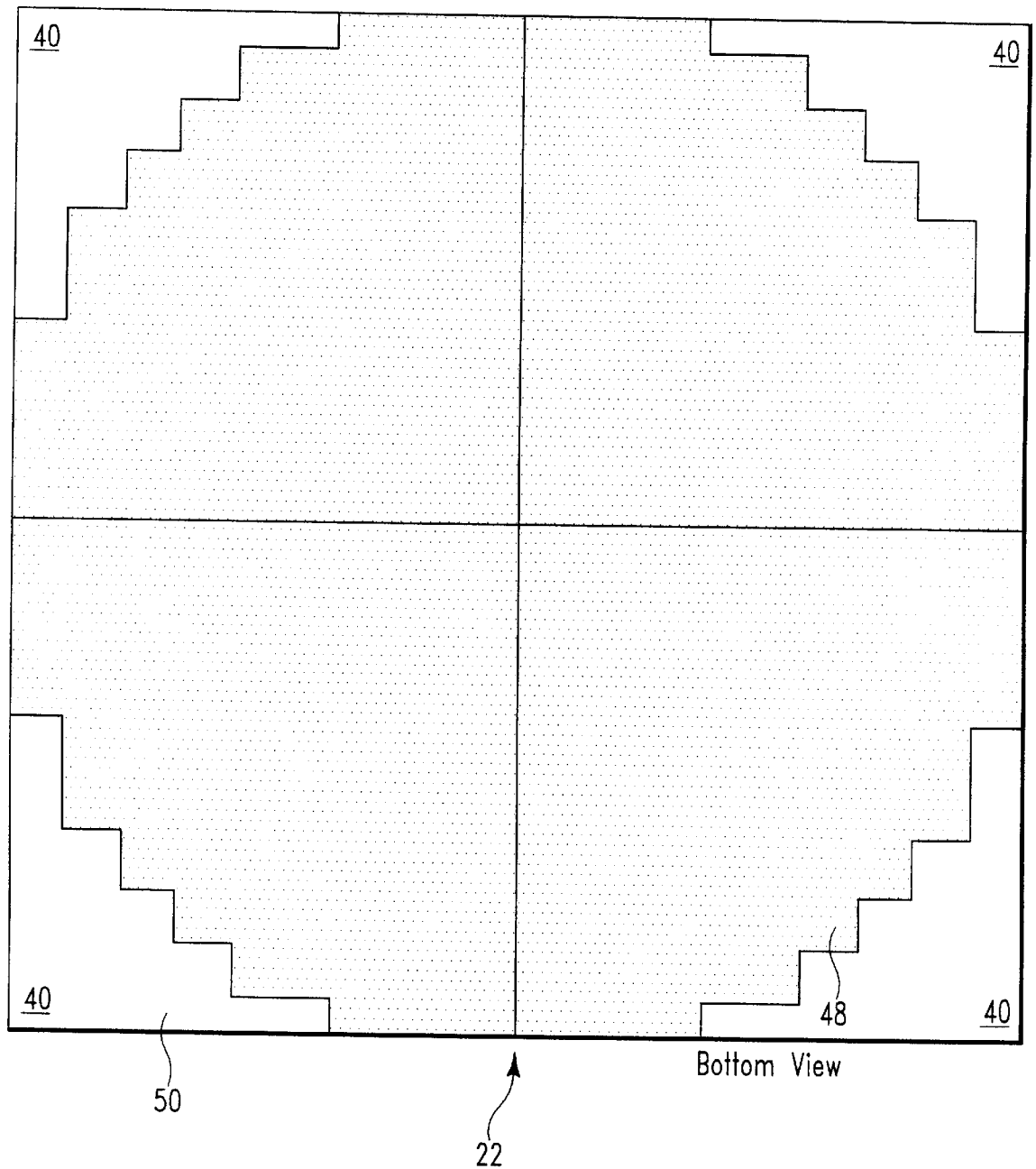
FIG. 2a is a plan view of the bottom side of the base of the personalization board showing the area containing a non-product specific layout of thick film vias illustrating an arrangement where the X and Y pitch are equal.
Figure 2B:
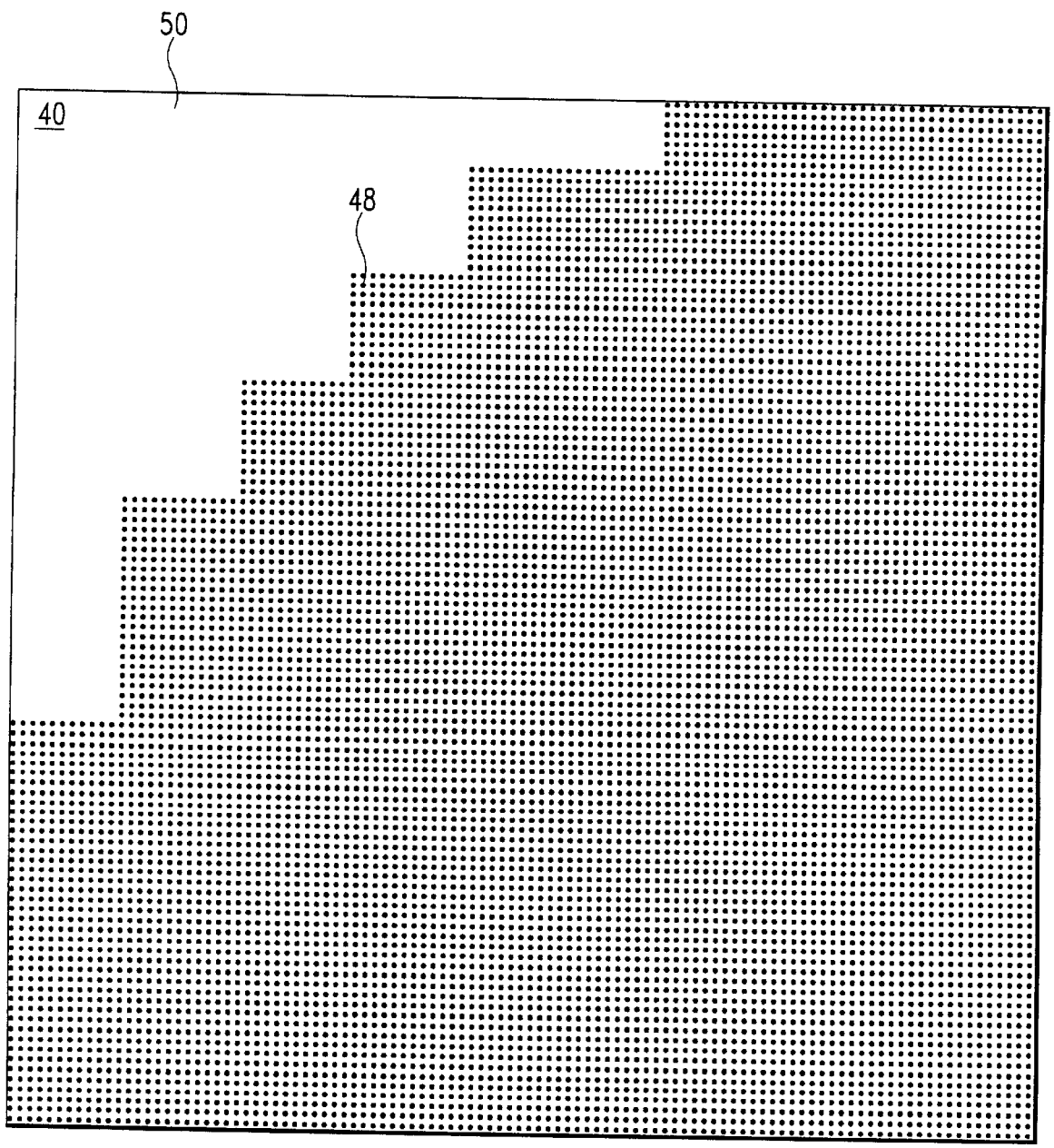
FIG. 2b is an expanded view of the layout of thick film vias of FIG. 2a showing an edge portion of a single tile near an edge of the personalization board.
Figure 2C:
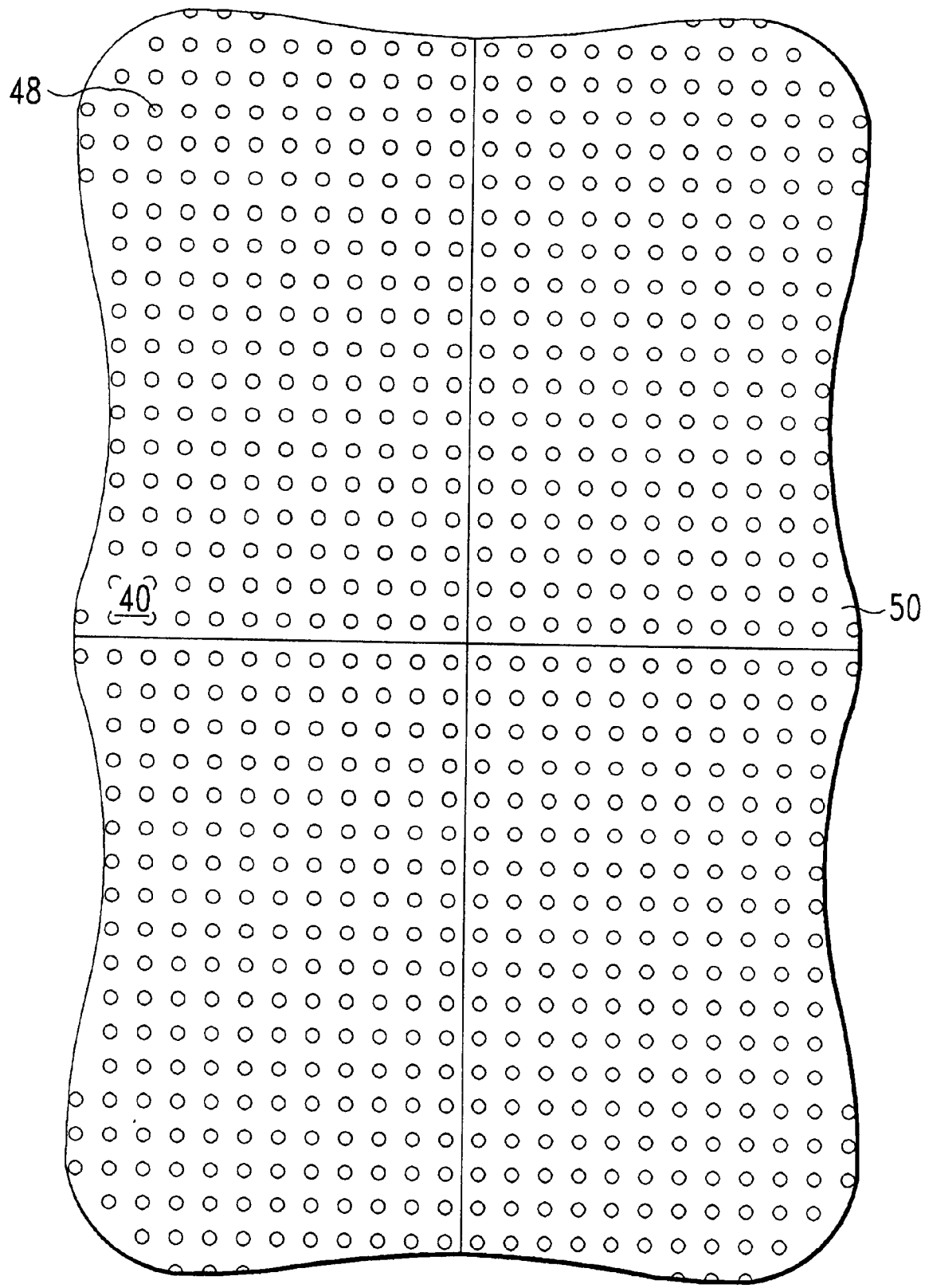
FIG. 2c is an expanded view of the layout of thick film vias of FIG. 2b showing the region of intersection of four tiles.

Personalization board 22 includes base 40, at least one thin film layer 42 and wafer contact probes 44 as shown in cross section in FIG. 1b, Preferably a standard base 40 is used having standard internal conductors (not shown) and their vias 48 on bottom surface 50 of base 40, as shown in FIGS. 2a–2c. Only thin film layers 42 and the arrangement of wafer contact probes 44 are modified to connect any contact footprint of product chips 30 to vias 48. Vias 48 have a standard pattern on base 40 for all products in a product family. An enlarged view of the arrangement of vias 48 near an edge of personalization board 22 is shown in FIG. 2b while FIG. 2c shows an enlarged view of the arrangement of vias 48 where four bases are tiled together near the center of personalization board 22. The arrangement of vias shown has equal X and Y pitch, but other arrangements are possible.

Thus, a wide range of product chips 30 within a product family (for example, memory, microprocessor, custom logic, and mixed signal logic) having different pad footprints can be contacted with a relatively simple modification of thin film layer 42 and contact probes 44 on base 40 to provide finished personalization board 22. By providing all personalization in thin film layer 42, base 40 is identical for all such personalization boards, lowering cost and decreasing fabrication time. Thin film layer 42 can include one or several conductive and insulating layers to form wiring pattern 52, as is well known in the art.

Figure 2D:
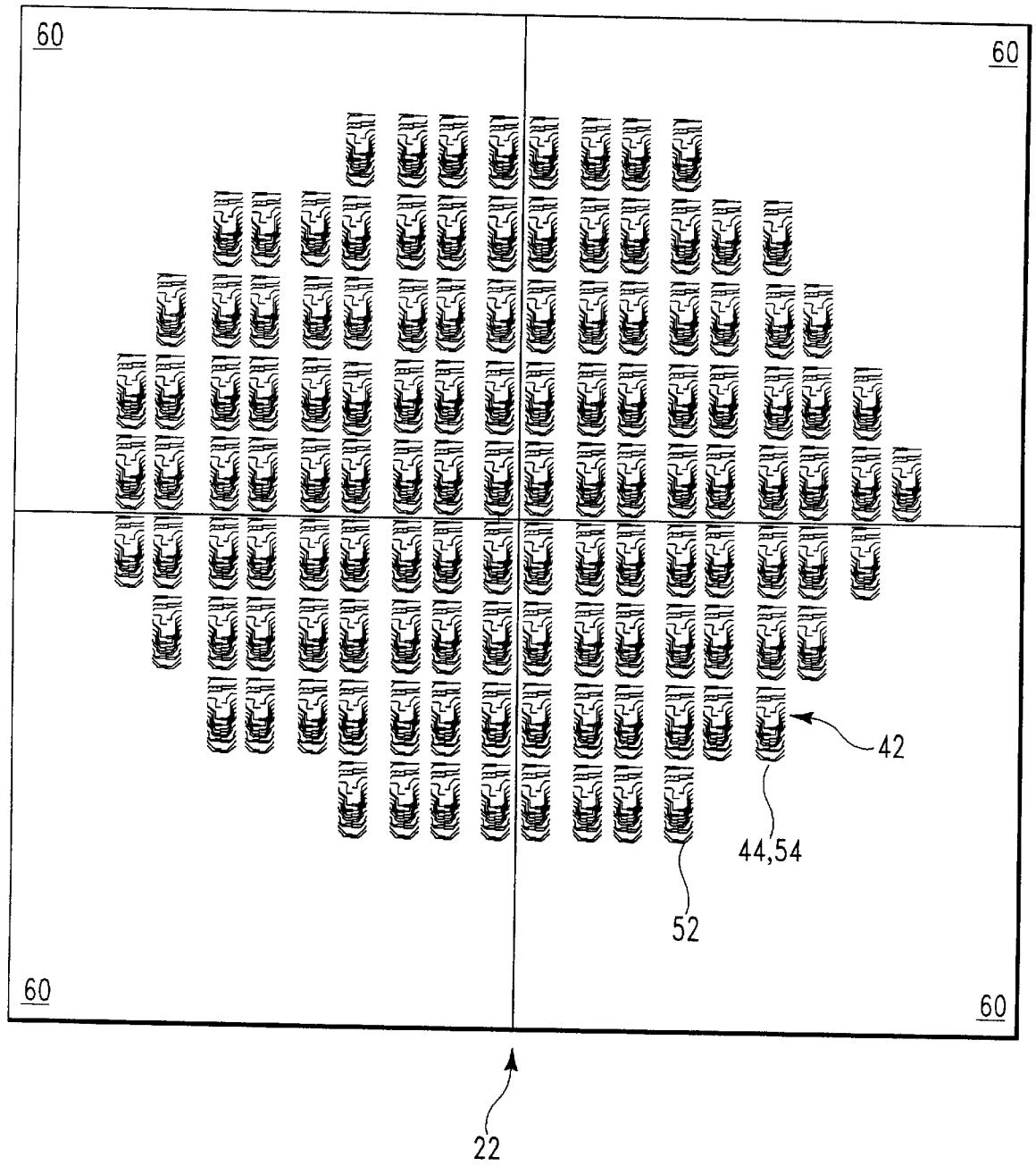
FIG. 2d is a plan view of the bottom side of the personalization board showing personalized thin film wiring to pads for personalized wafer contact probes for contact to an array of product chips on a product wafer.
Figure 2E:
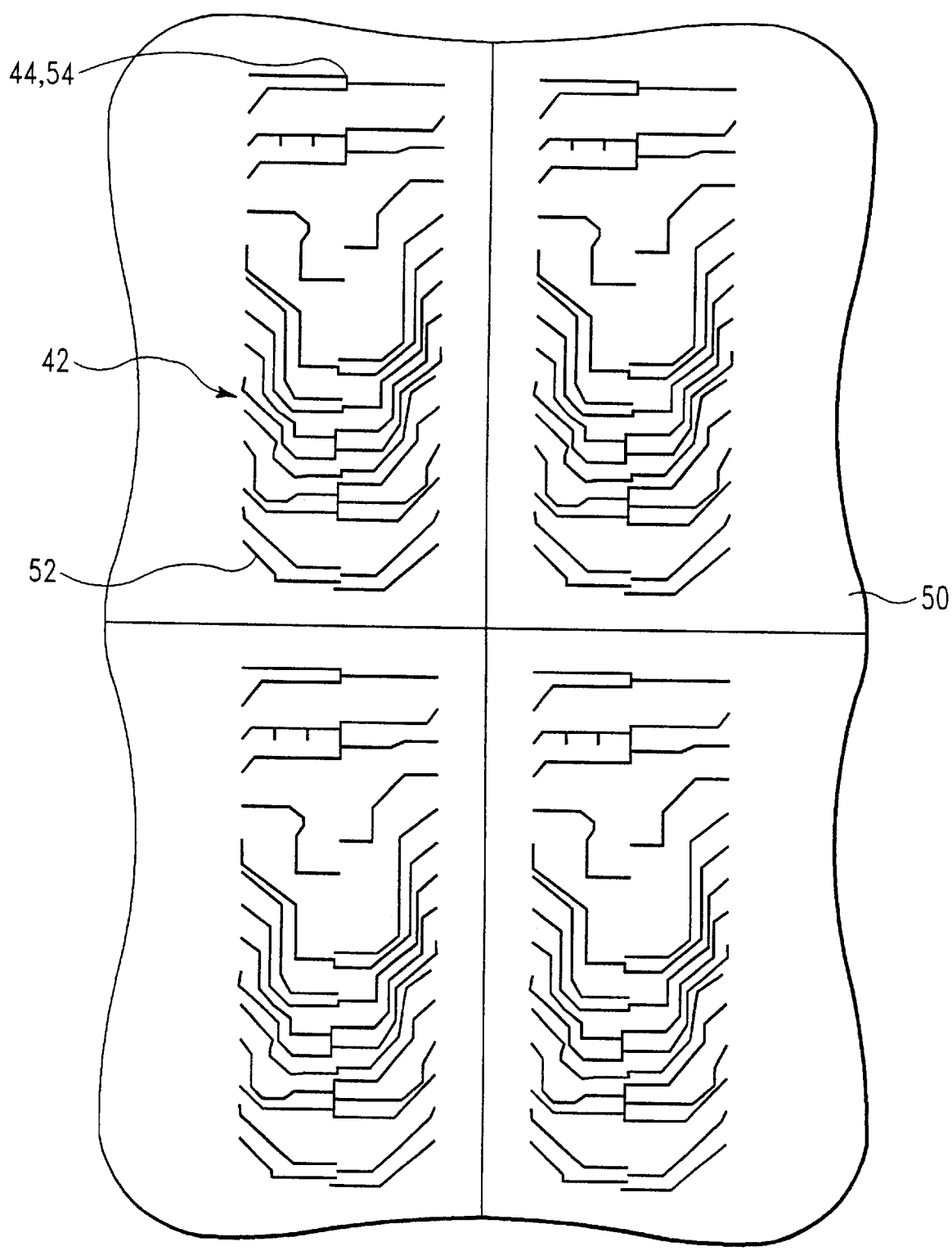
FIG. 2e is an expanded view of the personalized thin film wiring of FIG. 2d showing the region of the intersection of four tiles.
Figure 2F:
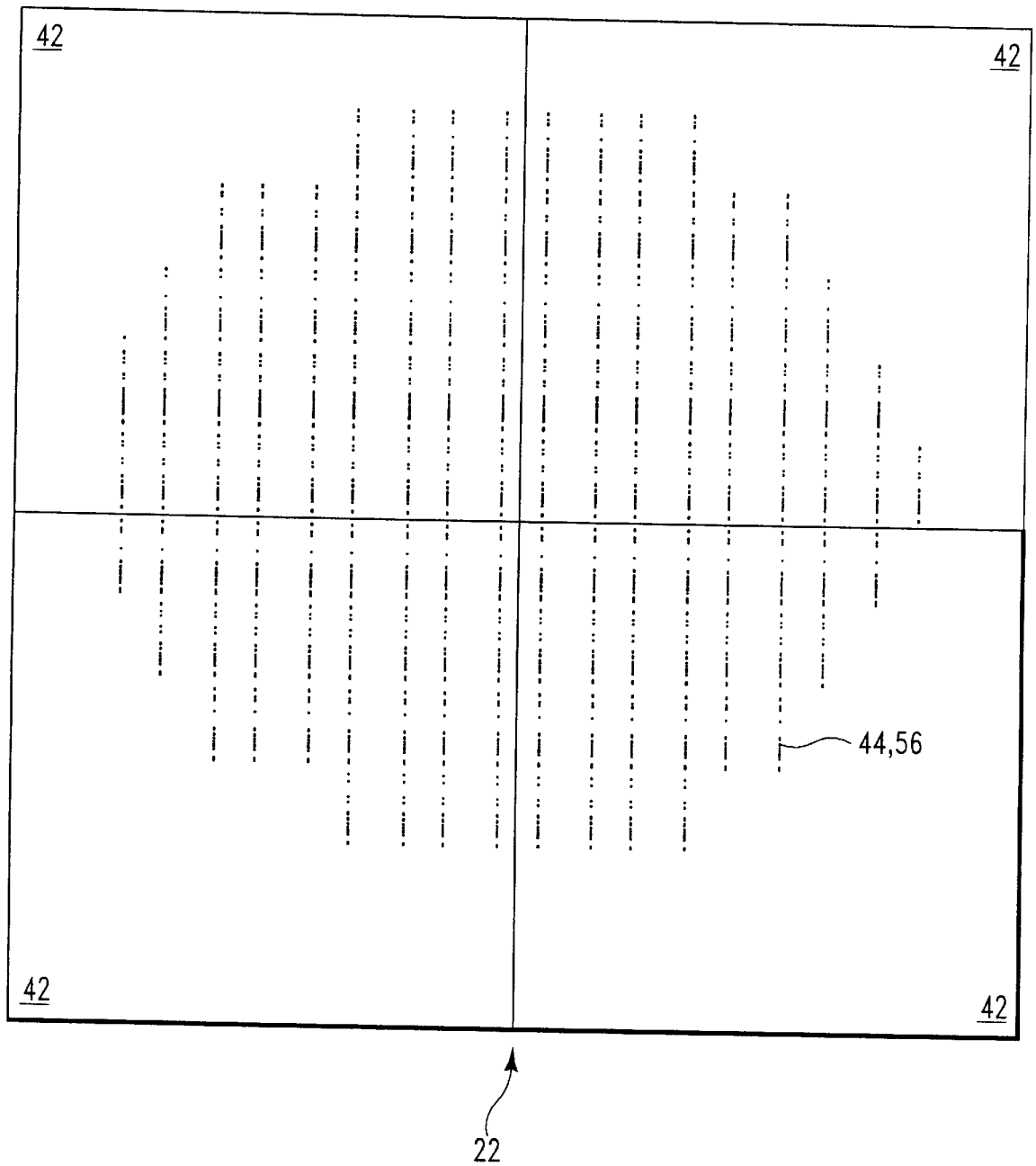
FIG. 2f is a plan view of the bottom side of the personalization board showing the arrangement of probe contact pads and wafer contact probes tailored for a specific product wafer.
Figure 2G:
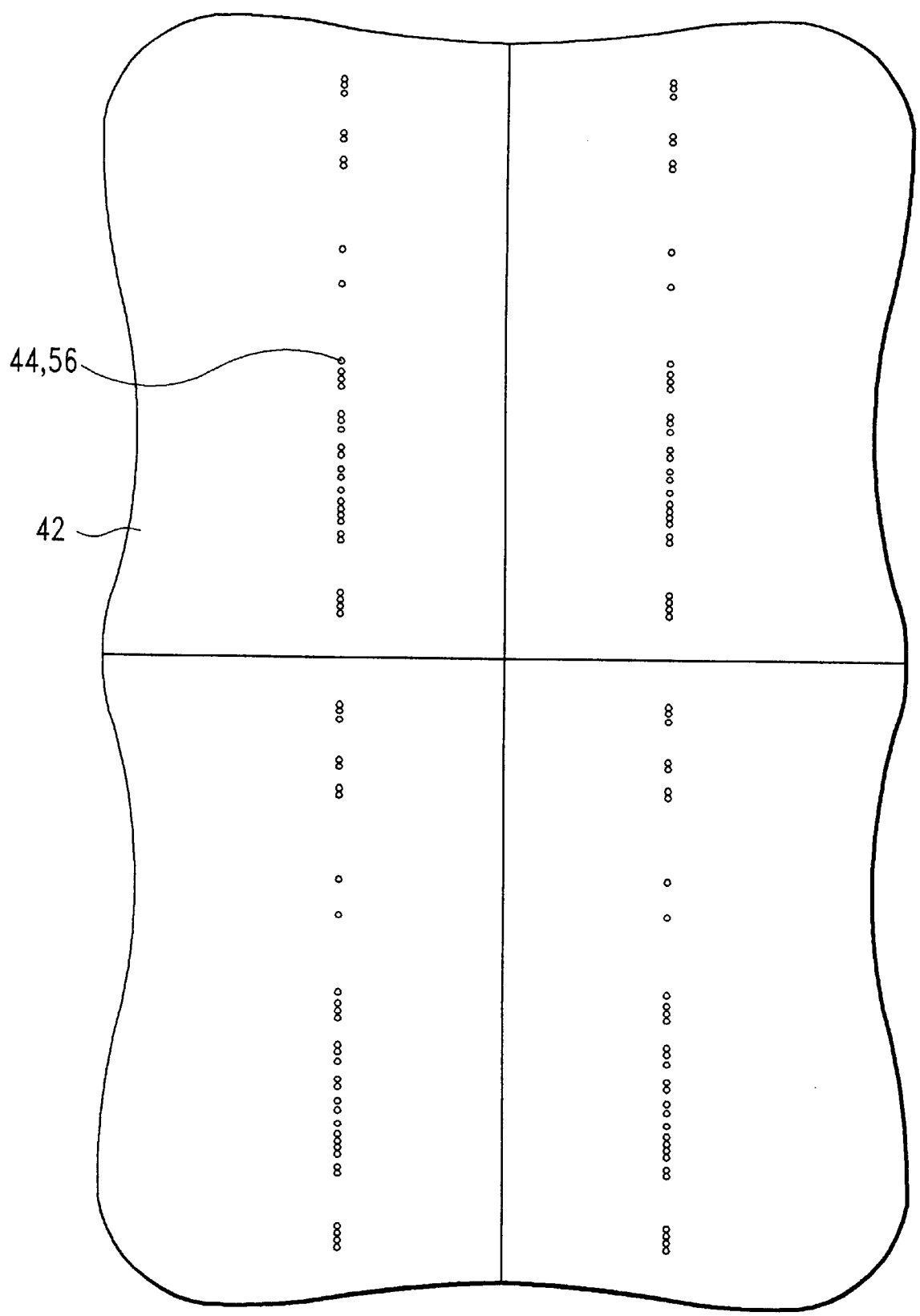
FIG. 2g is an expanded view of the probe contact pads and wafer contact probes of FIG. 2f showing the region of the intersection of four tiles.
Figure 2H:
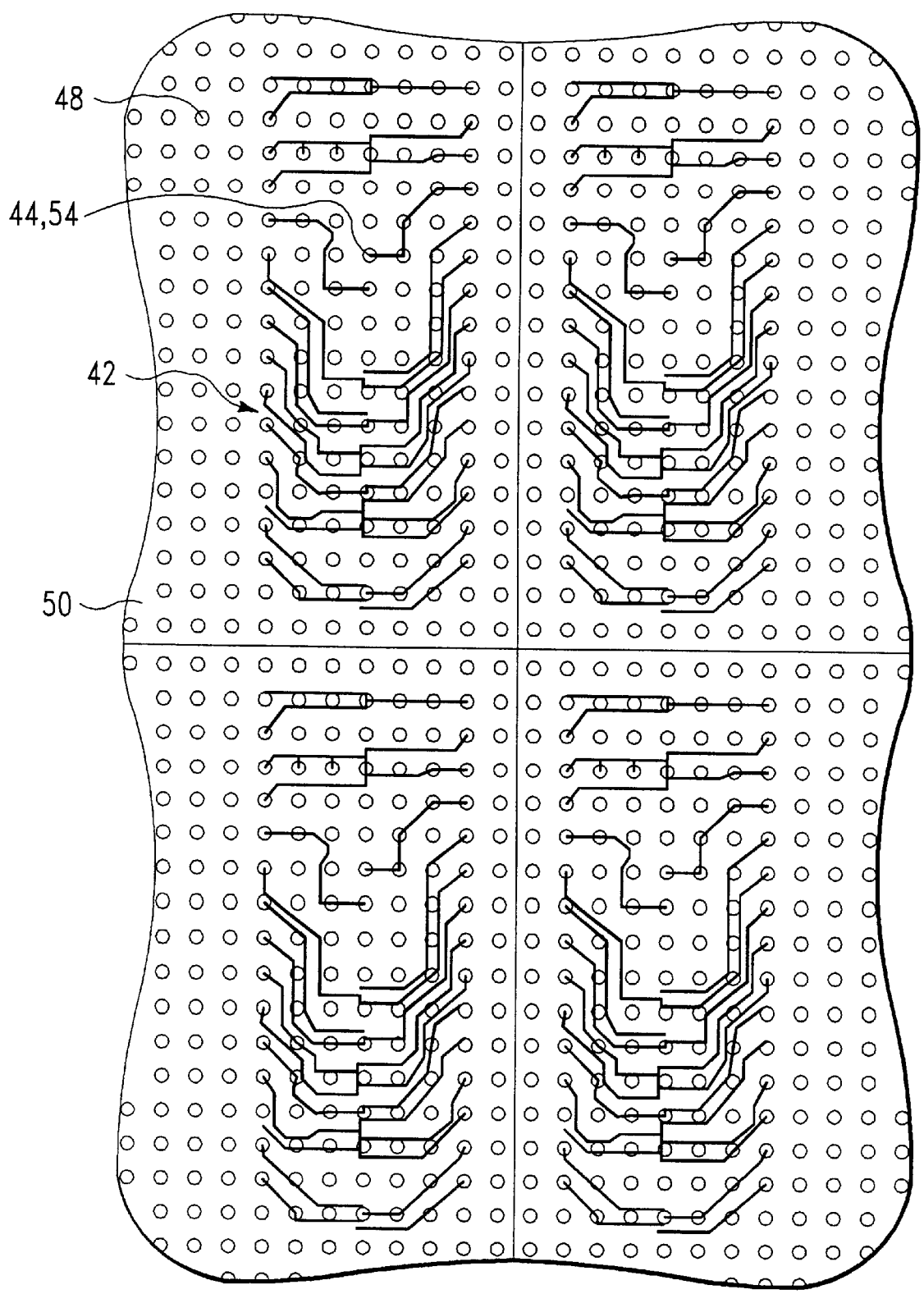
FIG. 2h is an overlay of the thick film vias of FIG. 2c, the personalized thin film wiring of FIG. 2e, and the probe contact pads and probes of FIG. 2g, showing the personalized connection from vias to probes.

Wiring pattern 52 in thin film wiring level 42 is personalized to connect vias 48 on bottom surface 50 of base 40 to probe contact pads 54, as shown in FIG. 2d and enlarged in FIG. 2e, and wafer contact probes 44 are affixed to probe contact pads 54, as shown in FIGS. 2f and 2g. The routing of wiring 52, and the location of probe contact pads 54 and wafer contact probes 44 are personalized to fit a particular chip pad footprint. In the case illustrated in FIGS. 2d–2g, a linear probe array of probes is provided for contacting the linear array of pads on a DRAM chip. FIG. 2h shows an overlay of vias 48 of FIG. 2c, wiring pattern 52 of FIG. 2e, and probe contact pads and wafer contact probes 44 of FIG. 2g, showing the connection therebetween.

Personalization board 22 may be formed of an array of several smaller boards or tiles 60. joined together as shown in FIGS. 1a, 2a and as described in the patent application Ser. No. 08/882,989. For probing an 8 or 12 inch wafer, a two by two array of 6 inch glass ceramic tiles 60 can be used. Preferably, each tile 60 in the array of tiles has a base 40 that is identical to the other bases, tiles 60 simply being rotated with respect to each other to provide the arrangement of contact to the four quadrants of a wafer, as shown in the bottom view of FIG. 2a. Of course thin film layer 42 and contact probes 44 are provided to bases 40 to account for the rotations and to provide a consistent orientation of contacts across personalization board 22, as shown in FIG. 2g. Wiring pattern 52 must also be personalized for each of the four tiles that make up a personalization board to account for board rotation.

Figure 2I:
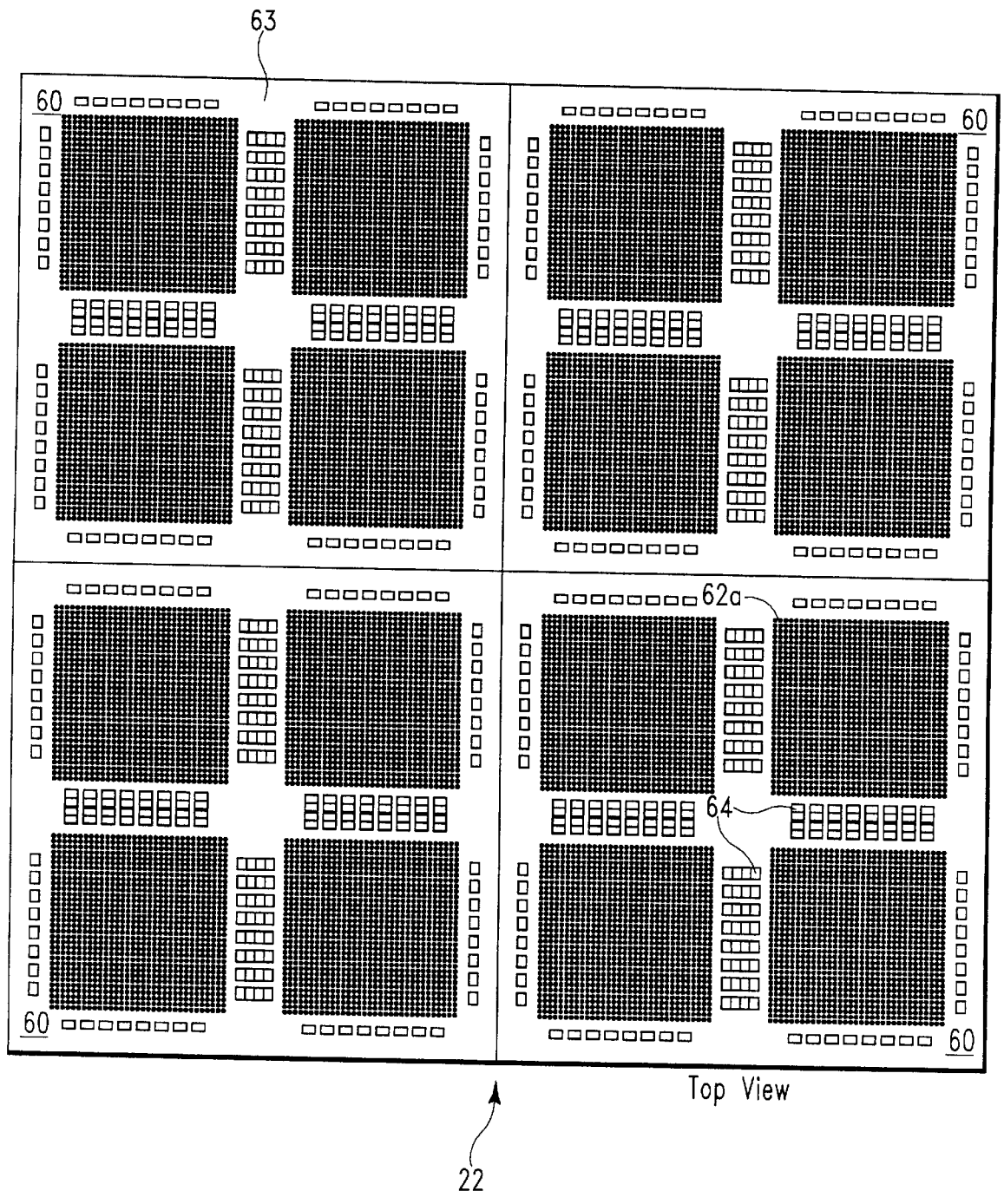
FIG. 2i is a plan view of the top side of the personalization board showing the array of contacts for inter-board connection and decoupling capacitors.

Array of contacts 62a for connection to carrier board 24 are located on top surface 63 of personalization board 22, facing carrier board 24, as shown in FIG. 2i. Decoupling capacitors 64 adjacent each array of contacts 62a and connected between power and ground contacts of array 62a provide decoupling capacitance very close to product chips 30 being tested. While decoupling capacitors 64 are shown on top surface 63 of personalization board 22, the surface opposite product chips 30, they may also be provided in thin film wiring 42 on the bottom surface of personalization board 22 facing product chips 30 for closer and improved decoupling.

Figure 3A:
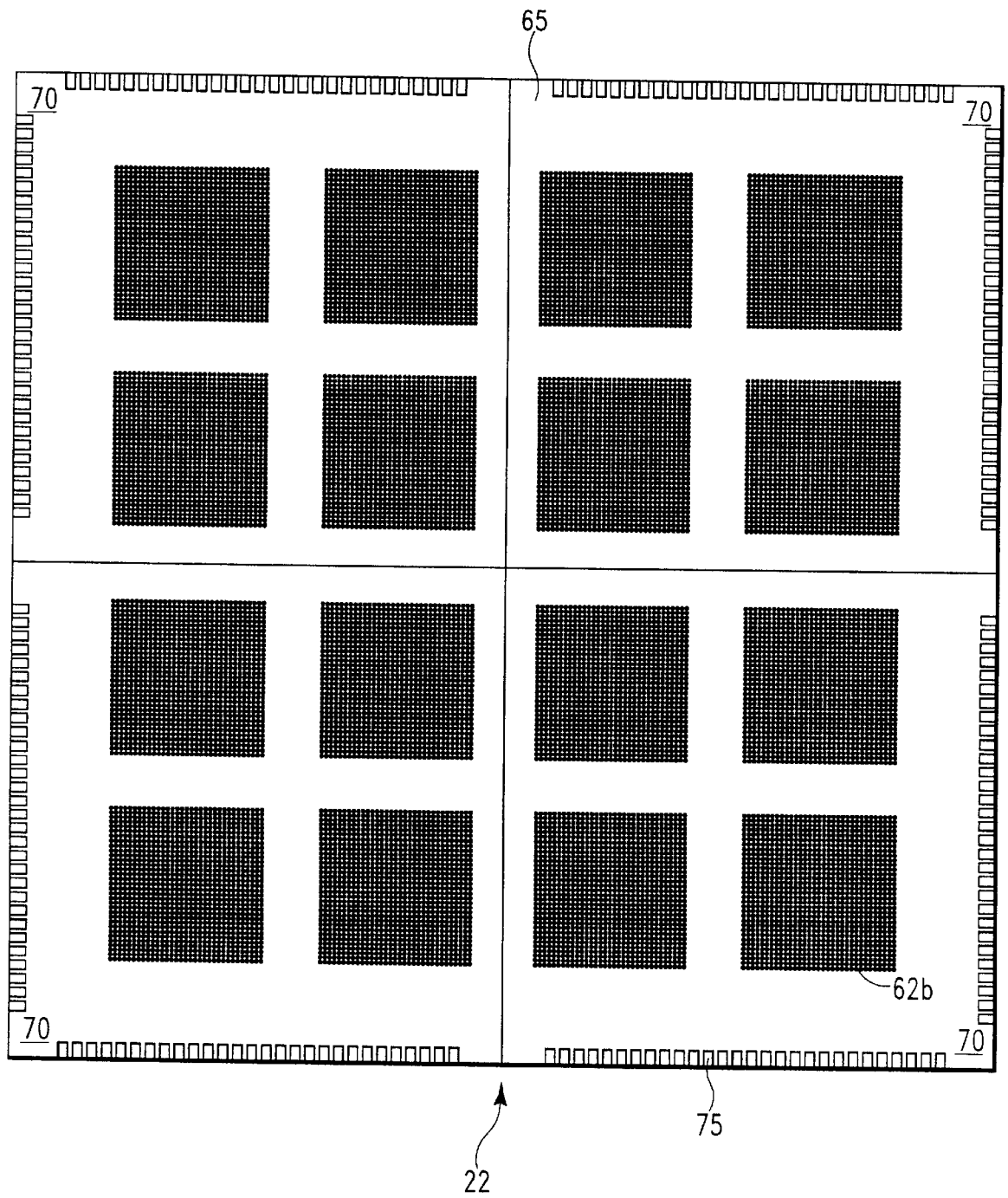
FIG. 3a is a plan view of the bottom side of the carrier board showing the array of contacts for inter-board connection and power bus tabs.
Figure 3B:
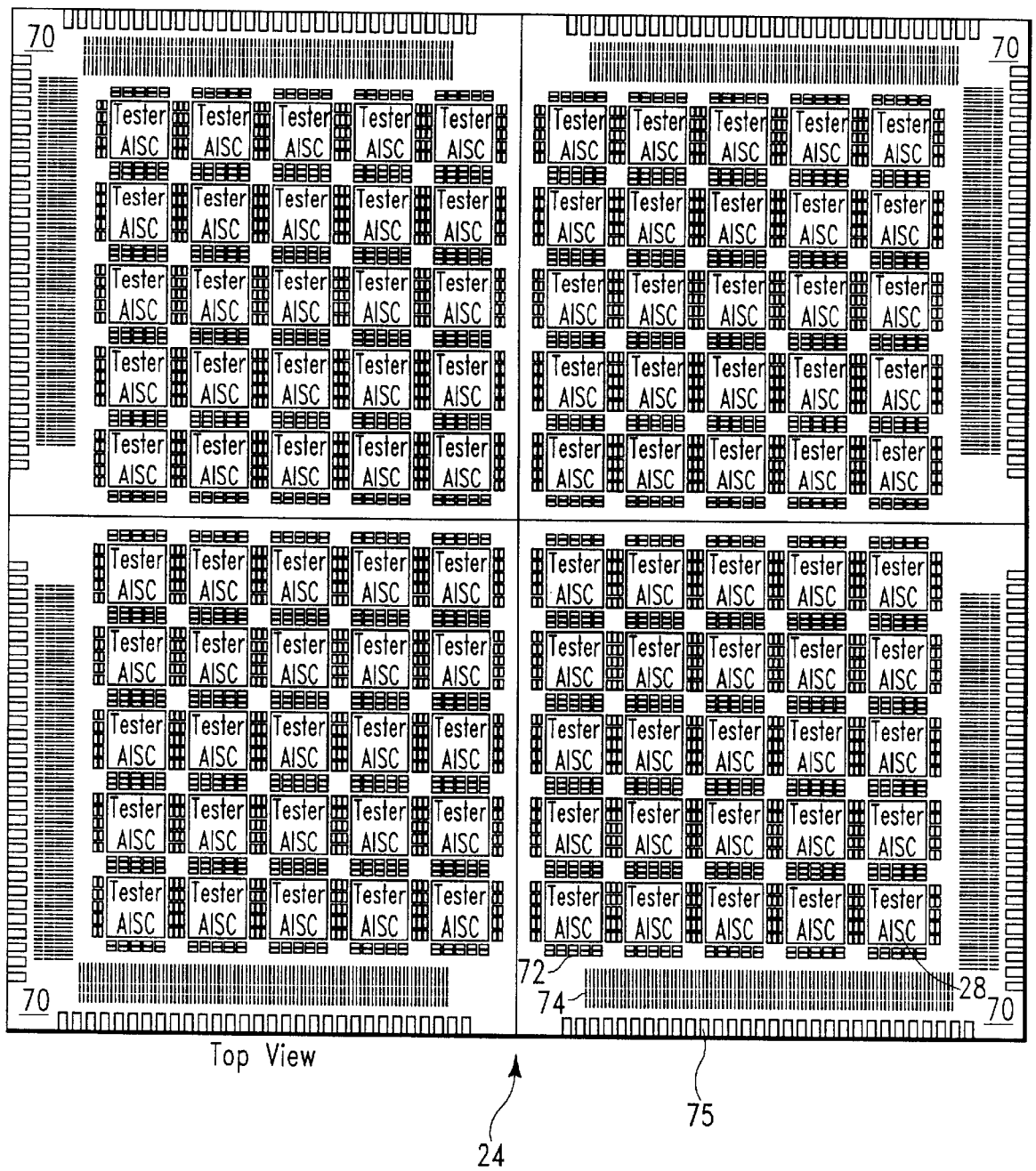
FIG. 3b is a plan view of the top side of the carrier board showing the array of tester chips, decoupling capacitors around each tester chip, power bus tabs, and pins for I/O connection to the carrier board.

Array of contacts 62b on carrier board 24 for connection to personalization board 22 are located on bottom surface 65 of carrier board 24, facing personalization board 22, as shown in FIG. 3a. Facing contacts 62a, 62b on boards 22, 24 have about equal dimensions, in the range from about 750 to 1000 micrometers (30 to 40 mils). Spacings between contacts are about 250 micrometers (10 mils), providing a pitch of about 1000 to 1250 micrometers (40 to 50 mils). Internal wiring (not shown) within carrier board 24 connect contacts 62b to thin film wiring (not shown) on top surface 70 of carrier board 24 on which are affixed tester chips 28, decoupling capacitors 72, and signal pins 74. Wiring that extends to tester chips 28, including power, ground, and signal lines, are provided in conductive wiring layers in carrier board 24 as described in the '257 patent. Power and signal connections are provided to carrier 24 through power tabs 75 and signal pins 74 as shown in FIG. 3b. Signals are provided to carrier 24 through cables from a tester that connect to signal pins 74.

The same carrier board 24 is used for all wafers within a product family that can be tested with tester chips mounted thereon, and carrier board 24 can be formed of a material thermally matched to product wafer 26 as described hereinabove. Thus, carrier board 24 can be formed of individual tiles 70 in a manner similar to tiles 60 of personalization board 22. And carrier board tiles 70 can be rotated as described for tiles 60 of personalization board 22, eliminating the need for four separate part numbers. In this case tester chips 28 would also be rotated. Personalization layer 42 on personalization board 22 is then set to account for the rotation. In this case, each of the four tiles 60 of personalization board 22 has a different thin film layer 42, and each such part can be used in only one specific quadrant of personalization board 22. While not required, a thin film layer could also be provided on carrier board 24 to provide additional wiring levels.

However, thermal matching requirements may be significantly relaxed for carrier board 24, eliminating the need for close thermal coefficient matching to the product wafer. First, carrier board 24 may not see the temperature excursion experienced by personalization board 22. This is the case where the test head is used exclusively for testing and may also be the case for burn-in if sufficient thermal resistance is provided between boards 22, 24. Second, since contacts between boards 22, 24 can be significantly larger than pads on wafer 30, inter-board connection can accommodate significantly more thermal mismatch than board to wafer connection. This, in addition to the materials described for personalization board 22, carrier board 24 can also be made of standard PC board materials such as FR4. Getek and Teflon.

The present inventors built and tested test head 20' comprising personalization board 22, formed of glass ceramic, and carrier board 24' formed of FR4, a standard PC board material, as shown in the embodiment illustrated in FIG. 4. Carrier board 24' includes daughter cards 28' for each chip on wafer 30 that provide a simple way to disconnect shorted product chips 30 from wafer 26. Daughter cards 28' can simply be removed to disconnect contact to such shorted chips. Alternatively, tester chips 28 including test circuits, power supply control circuits (such as voltage regulators), memory, timing and format generation, pin electronics and supporting circuits, such as digital to analog converters, can all be provided on daughter cards 28'. Tester chips 28 need not all be identical, and several different chips can be used to provide the various test functions and for fanout between signal pins 74 and other tester chips.

Figure 5A:
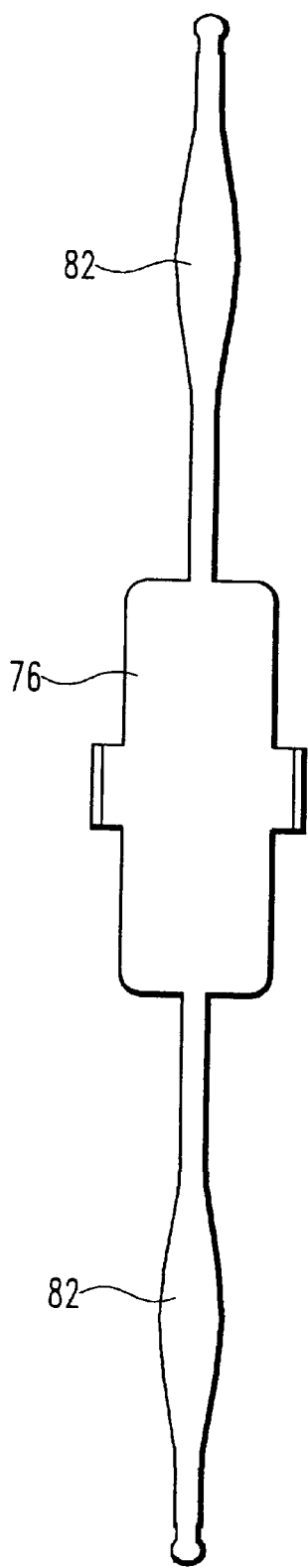
FIGS. 5a–5b are side views of pins used for inter-board connection.
Figure 5B:
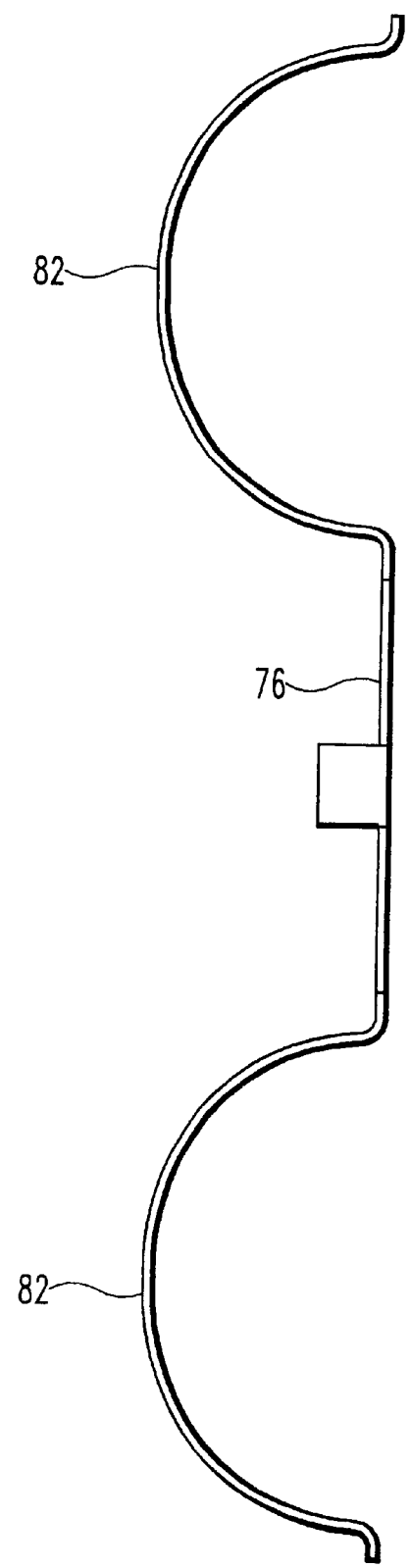
Figure 5C:
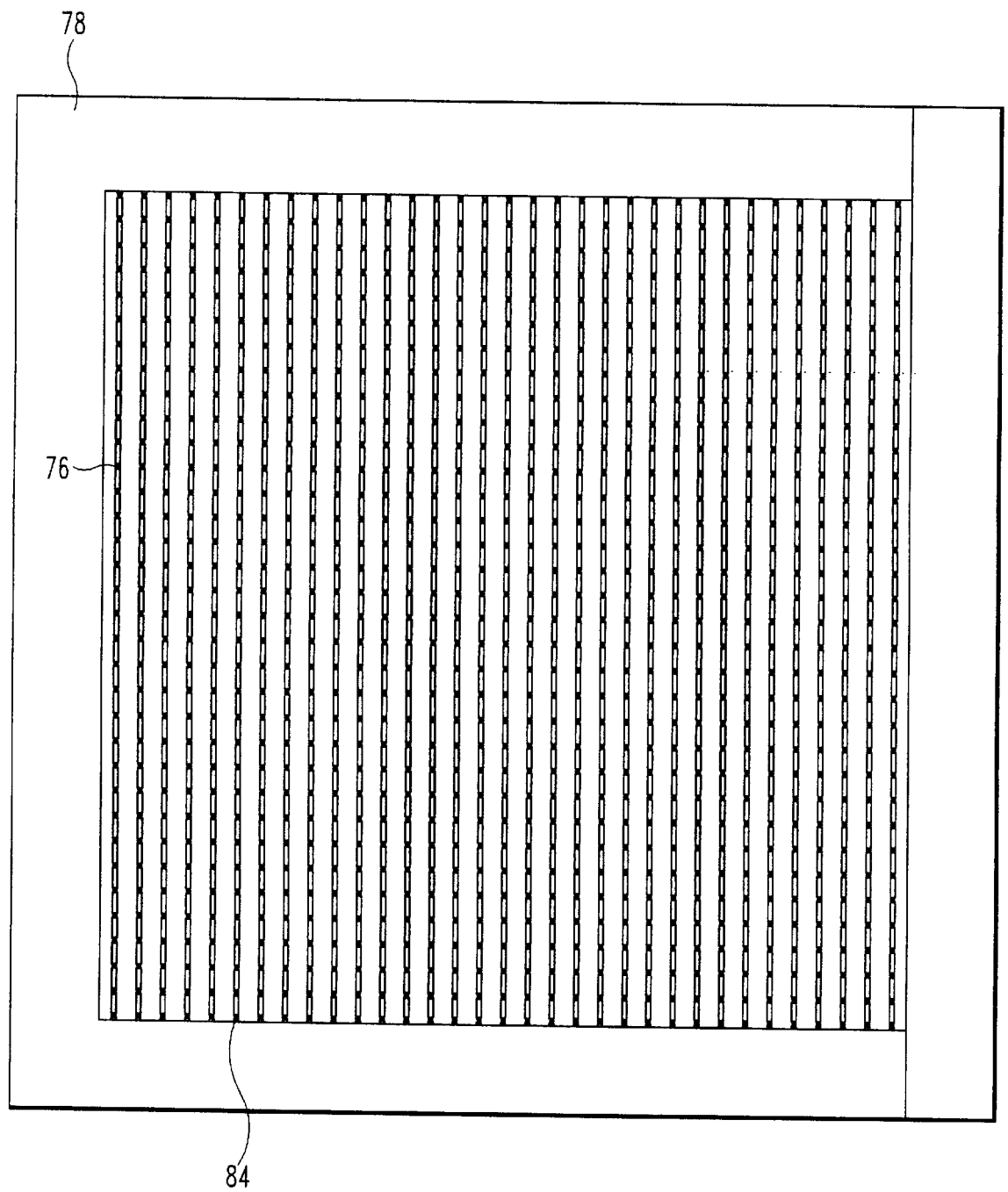
FIG. 5c is a plan view of the interconnect housing for the pins of FIGS. 5a–5b.

Contact between personalization board 22 and carrier board 24 is provided through interconnect pins 76 extending through plastic interconnect housings 78, described in commonly assigned copending U.S. patent application Ser. No. F1995167, incorporated herein by reference. Four interconnect housings 78 are mounted in Invar frame 80 for each tile of personalization board 22, as shown in FIGS. 1a–1b and, greatly enlarged, in FIGS. 5a–5c. Front and side views of pins 76 are shown in FIGS. 5a–5b, respectively. Each pin is formed of a single piece of wire having a radius of curvature 82 to provide spring pressure contact between boards 22, 24. Interconnect housing 78 has slots 84 for each pin to enable flex of pins 76 as shown in FIG. 4c. Each interconnect housing 78 provides a 33 by 33 array of pins 76 for interconnecting, contacts 62a, 62b on the two facing boards 22, 24, providing 1089 contacts therebetween and 17,424 individual contacts for an entire product wafer. Invar frame 80 provides thermal matching over the large area provided by test head 20. Contacts 62a, 62b on boards 22, 24 are provided with a large enough dimension, about 30 to 40 mils, so that any thermal gradient or thermal expansion coefficient difference between interconnect housings 78 and either board are accommodated.

In assembling the test head 20, invar frame 80 is aligned and glued to personalization board 22. Interconnect housings 78 are then installed in invar frame 80. Carrier 24 is then positioned for connection between pins 76 and pads 62b. A force of about 15 grams per pin is applied between wafer 26 and test head 20 to ensure good electrical connection between components.

To ensure that carrier board 24 is maintained at a significantly lower temperature than wafer 26 or personalization board 22 during burn-in, thermal resistance is provided between boards 22 and 24. Thermal resistance is most easily provided by an air gap between boards 22, 24 and invar frame 80 or plastic interconnect housings 78. Improved thermal resistance is provided by sealing and evacuating the space between the boards with an O ring or other gasket. By providing sufficient thermal resistance between personalization board 22 and carrier board 24, tester chips 28 can be maintained at a temperature of 85° C. or lower while product chips 30 are burned-in at a temperature of 140° C. or higher. Thus, repeated burn-in stressing of tester chips 28 is avoided, and their useful life enhanced.

In addition to providing improved thermal resistance, evacuating the space between boards 22 and 24 also provides the force required to compress pins 76 and thus provide good electrical contact between pads 62a, 62b.

Figure 6A:
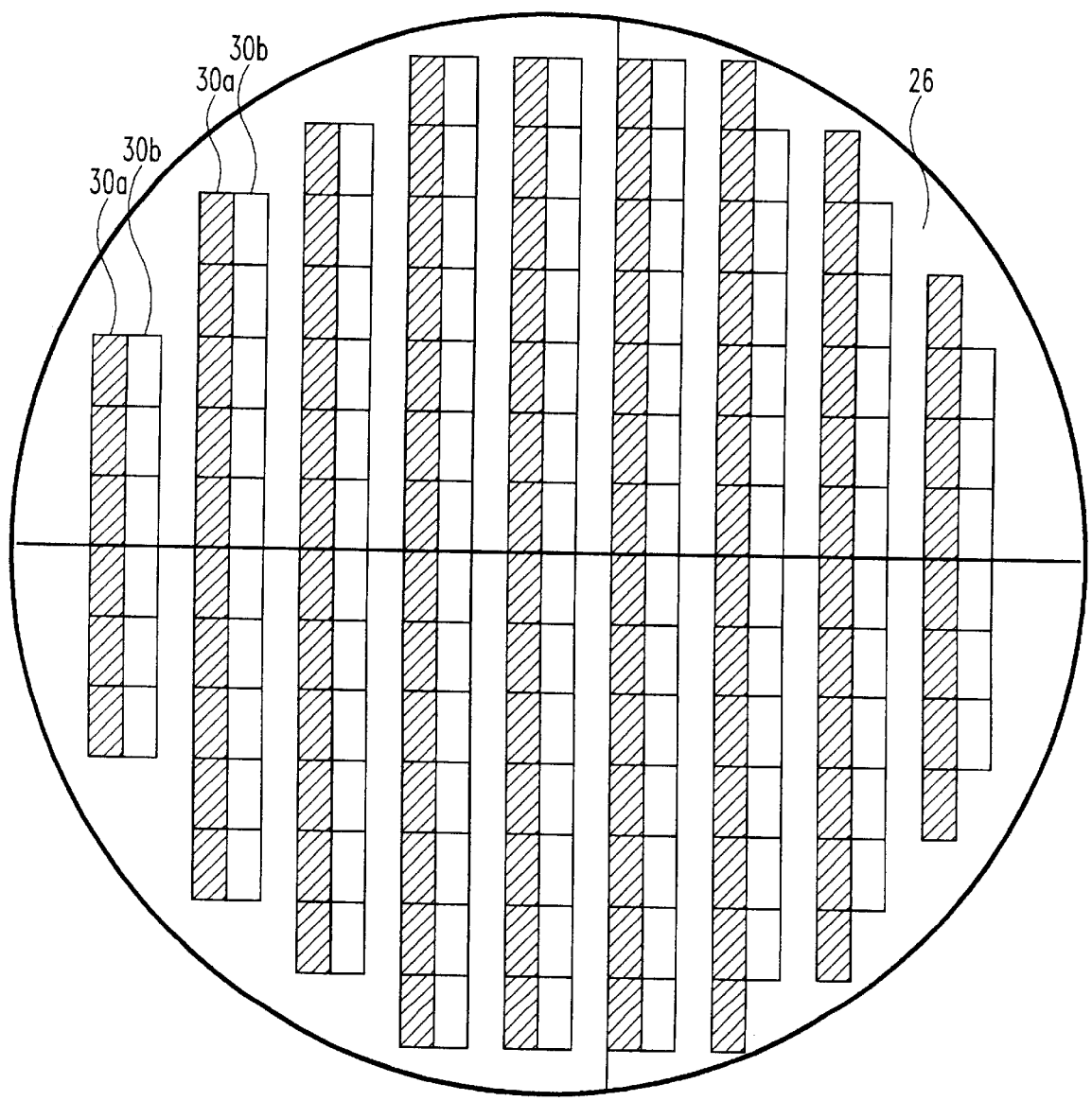
FIGS. 6a–6b show the testing of a product wafer with a test head of the present invention populated for testing alternate rows of product chips.
Figure 6B:
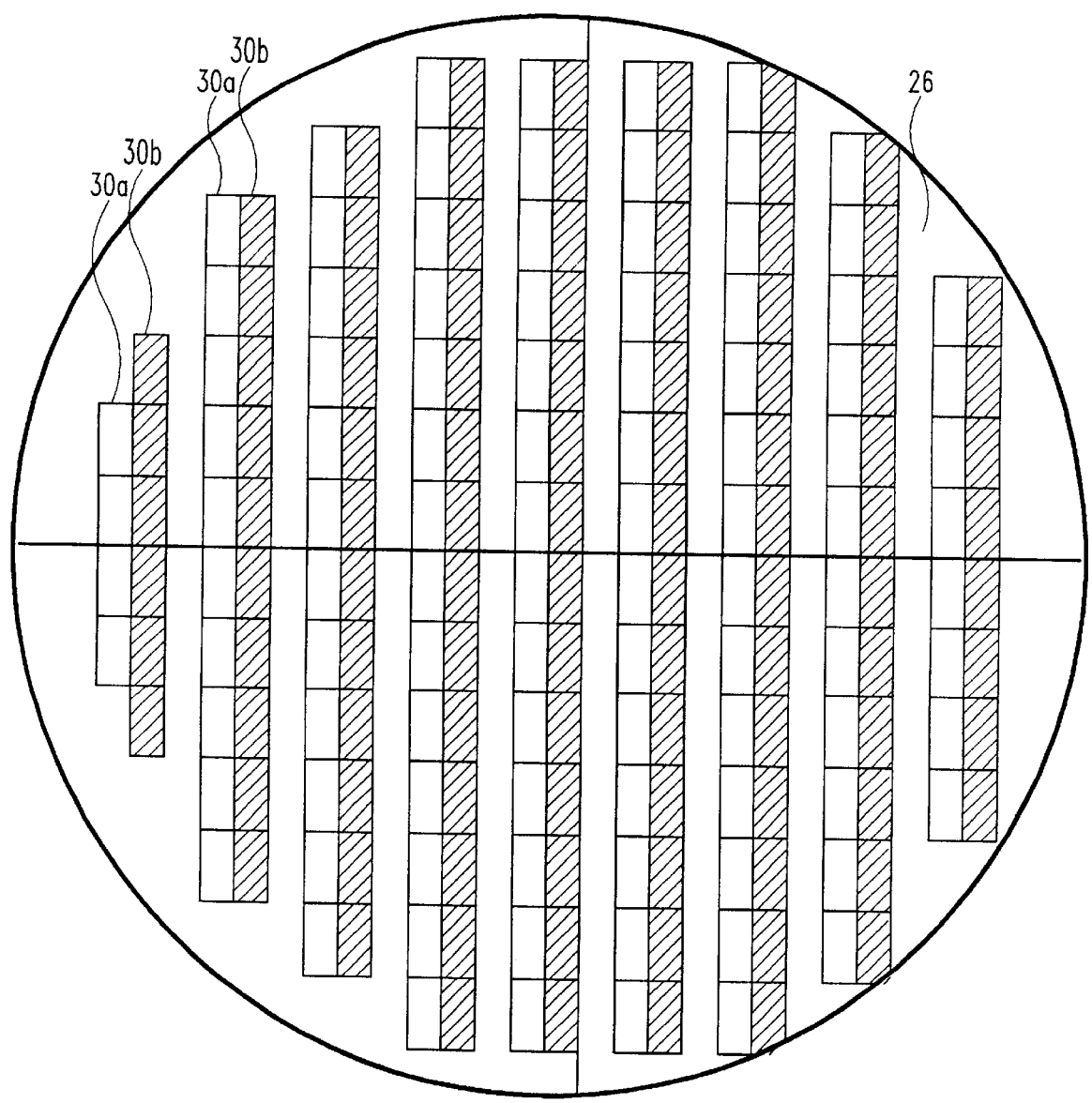

While the present invention can accommodate testing or burning-in of all product chips 30 on product wafer 26 simultaneously, it can also provide testing of fewer chips. As illustrated in FIGS. 6a, 6b, half the chips are tested in each of two steps of test head 20. Shaded areas indicate a region of contact between test probes 44 of test head 20 and product chips 26 on product wafer 30. First, as should in FIG. 6a, test head 20 is positioned to contact columns 30a of product chips 30 for testing simultaneously. Then, after that test is complete, test head 20 is stepped to make contact with columns 30b of product chips for a simultaneous testing step. Thus, all chips on wafer 26 are contacted and fully tested in only two testing steps.

Two methods are available for providing the force needed for contacting wafer 26 to test head 20. Conventionally, wafer 26 is held by vacuum to a vacuum chuck mounted on an X—Y—Z—θ stepper and mechanical force and positioning are provided through the X—Y—Z—θ stepper. Alternatively, while the positioning is still provided by the X—Y—Z—θ stepper, as shown in FIGS. 7a–7b, force between water and test head is augmented by providing vacuum between chuck and test head.

Figure 7A:
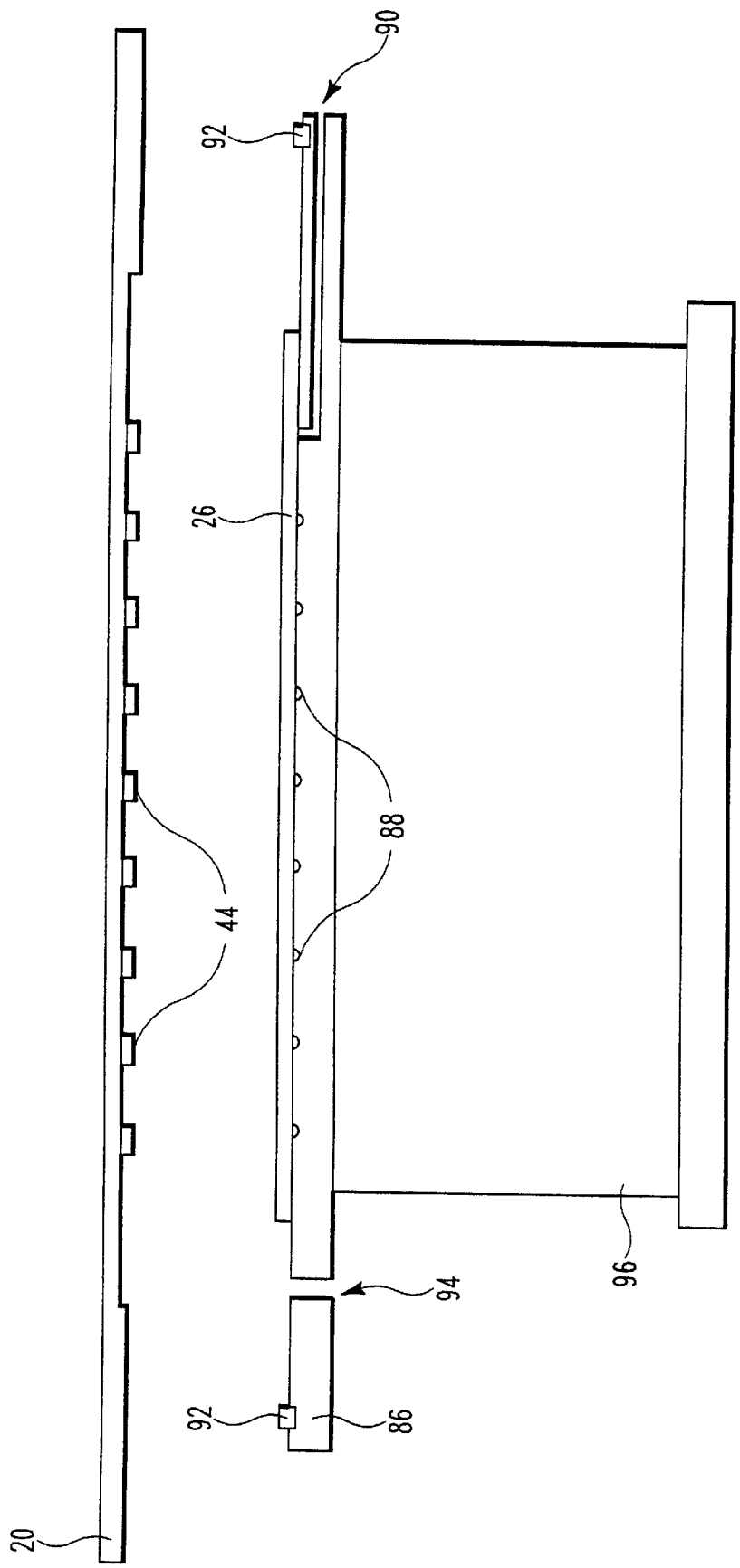
FIGS. 7a–7b show the contacting of a product wafer with a test head of the present invention using atmospheric pressure augmentation of the force connecting the vacuum chuck holding the product wafer to the test head.
Figure 7B:
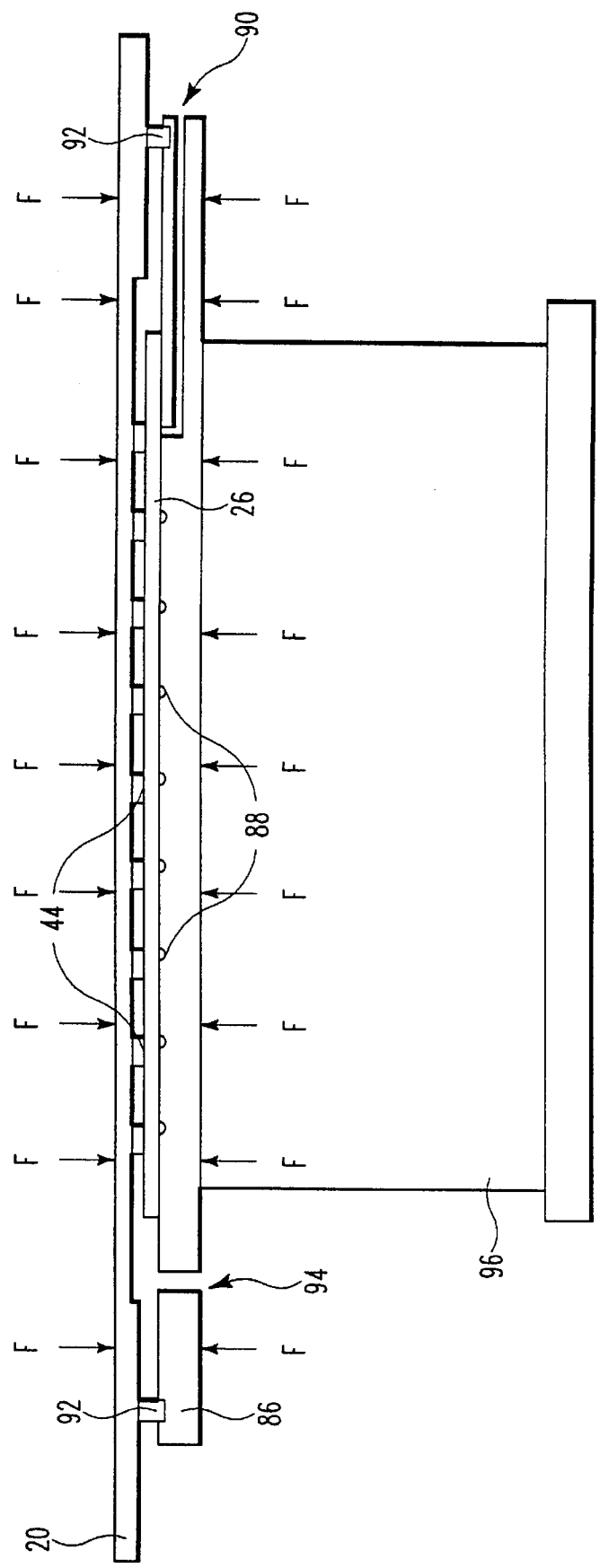

As shown in FIG. 7a, wafer 26 is vacuum mounted on vacuum chuck 86 having vacuum grooves 88 and wafer hold-down vacuum port 90. Vacuum chuck 86 also has O-ring seals 92 and probe system vacuum port 94 for enabling, vacuum sealing of chuck 86 to test head 20, as shown in FIG. 7b. Up to atmospheric pressure F is thereby applied to uniformly compress all wafer contact probes 44. If needed additional pressure can be provided by conventional mechanical means. Wafer 26 can also be clamped to chuck 86 by mechanical or electrostatic methods. In addition to O-ring seals 92, other seals, such as gaskets or C-rings can be used. Preferably the compliance of the seal is about equal to the compliance of probes 44.

FIGS. 8a–8b illustrate stepping of wafer 26 relative to test head 20. Once a first set of chips on wafer 26 have been tested, as shown in FIG. 8a, vacuum is released from probe system vacuum port 94, and chuck 90 is lowered (FIG. 7a). Chuck 86 carrying wafer 26 is then realigned through the X—Y—Z—θ stepper 96. Chuck 86 is then raised to reestablish contact between wafer 26 and test head 20 for contacting another group of chips as shown in FIG. 8b. The use of vacuum permits a significantly higher and more uniform force to be applied with lower mechanical stresses than can be provided by conventional systems that rely entirely on mechanical force. This is particularly an advantage for probe arrays having a large number of probes spread over a large area.

Figure 9A:
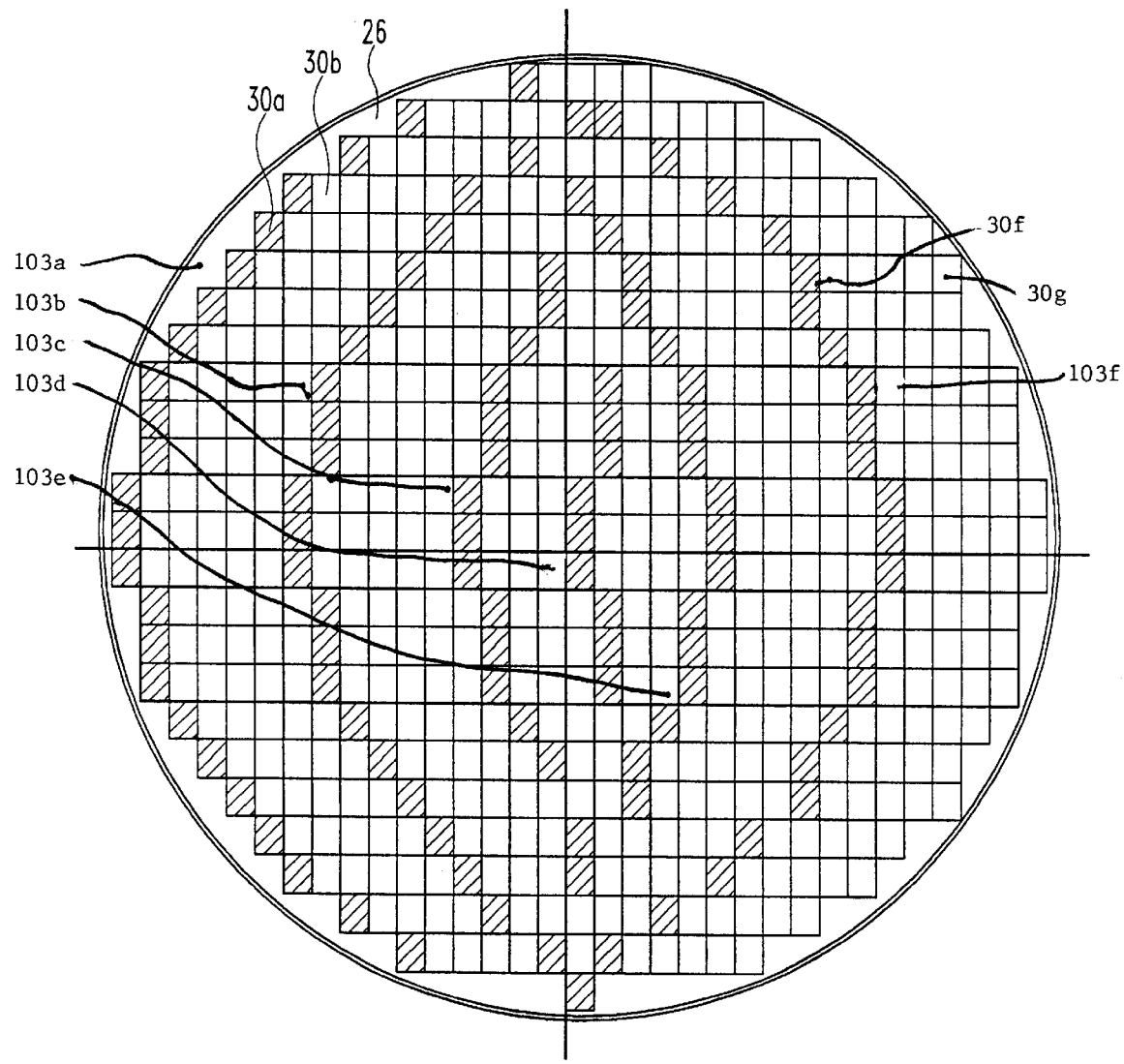
FIGS. 9a–9b show probe contacts to a product wafer with a probes arranged in striped configurations, in FIG. 9a, crescent shaped stripes and in FIG. 9b, straight line shaped stripes.

Test throughput is significantly improved over the straight line probe pattern of FIGS. 6a–6b, using the crescent shaped test probe pattern of FIG. 9a. The crescent shape permits nearly all probes to hit a chip at each step, substantially increasing efficiency and reducing the number of steps required for full wafer testing. For example the 604 die shown in FIG. 9a can be tested with a 128 chip parallel tester in only 6 steps. With the straight line probe pattern of FIG. 9b or an area array probe pattern (not shown), using symmetric tiles with 32 probes per tile, 8 steps would be required. Thus, the crescent shaped arrangement of probes provides a 25% increase in throughput compared to the standard area array or straight line stripe shaped pattern. Further advantageously, the crescent shaped probe pattern provides a more uniform and constant force than the area array or striped pattern. In addition the area needed for sealing for vacuum assist Z force is reduced. Furthermore, the number of probes that extend beyond the wafer edge are substantially reduced, substantially limiting the possibility of probe damage. Finally, the stepping is all in one direction for the crescent or stripe shaped probe patterns, simplifying prober apparatus and mechanism The area array pattern requires stepping in several directions.

In the first testing step all shaded chips 30a of FIG. 9a are tested. Wafer 26 is then stepped in the -X dimension and chips 30b adjacent the shaded chips are tested. This procedure is repeated until all chips are tested, in this case requiring six probe touchdowns.

Figure 9B:
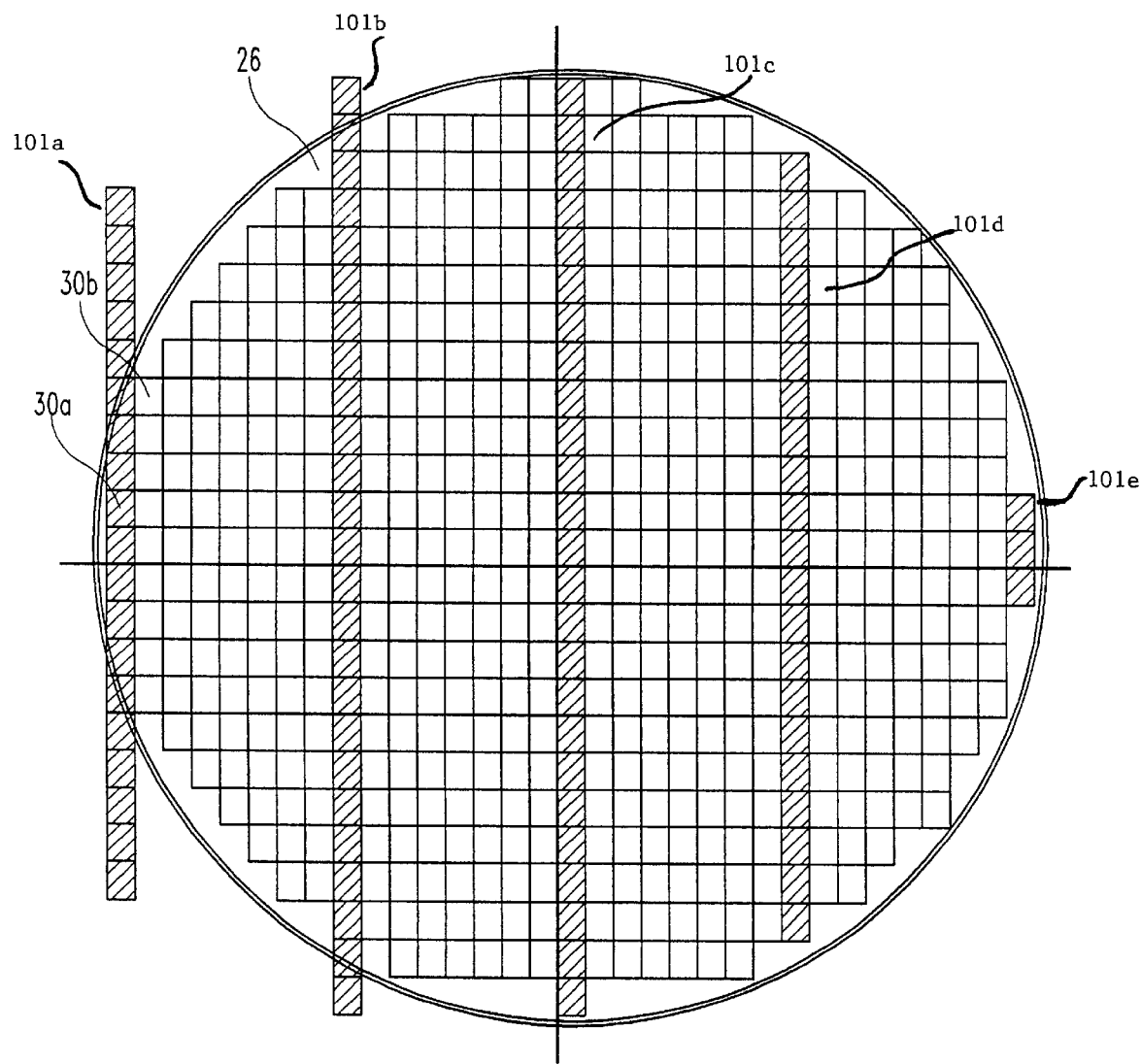

As is evident from both FIGS. 9a and 9b, multiple stripe test probe patterns 101a–101e (FIG. 9b) or multiple crescent test probe patterns 103a–103f (FIG. 9a) provide that chips 30b are not tested between chips 30a that are tested. The number of untested chips between test probes along each row is constant so that all chips on the wafer are tested in a small number of steps. In the case of FIG. 9a, the entire wafer can be tested in six testing steps. Different crescent test probe patterns 103a, 103b of FIG. 9a can have substantially equal convexity and can have an approximately constant number of untested chips between them along each row. Alternatively different crescent test probe patterns 103a, 103e shown in FIG. 9a have very different convexity and different spacing from each other along each row. In addition different crescent test probe patterns 103a, 103e of FIG. 9a face in opposite directions and have opposite convexity. As mentioned herein above, this configuration that combines crescent test probe patterns with different convexity and opposite convexity accomplishes two tasks: (1) minimizes the number of steps needed to test a wafer: and (2) substantially avoids or reduces a set of probes stepping off the wafer.

As is also evident from FIG. 9a, to design crescent test probe patterns 103a–103f, first crescent test probe pattern 103a of multiple crescent pattern 103a–103f has probes arranged to probe first chip 30a in every row of chips adjacent one edge of wafer 26. Next crescent test probe pattern 103b is generated by counting a constant number of chips away from first crescent test probe pattern 103a. Last crescent test probe pattern 103f is generated by counting that same number of chips away from last chip 30g in every row along the opposite wafer edge. This eliminates or minimizes the number of probes that step off the wafer. Additional intermediate crescent test probe patterns 103c, 103d, 103e are provided in a similar manner or are placed to ensure that every chip on wafer 26 gets tested while minimizing duplicate probing of any chip.

Figure 10A:
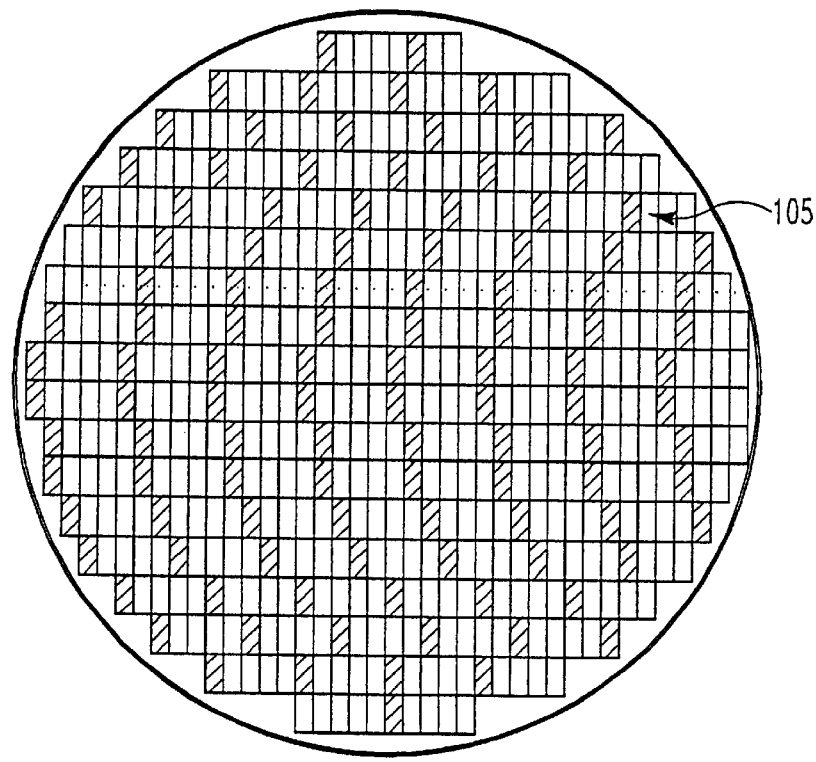
FIG. 10a shows probe contacts to a product wafer with a probes arranged in crescent shaped stripes all facing the same direction.
Figure 10B:
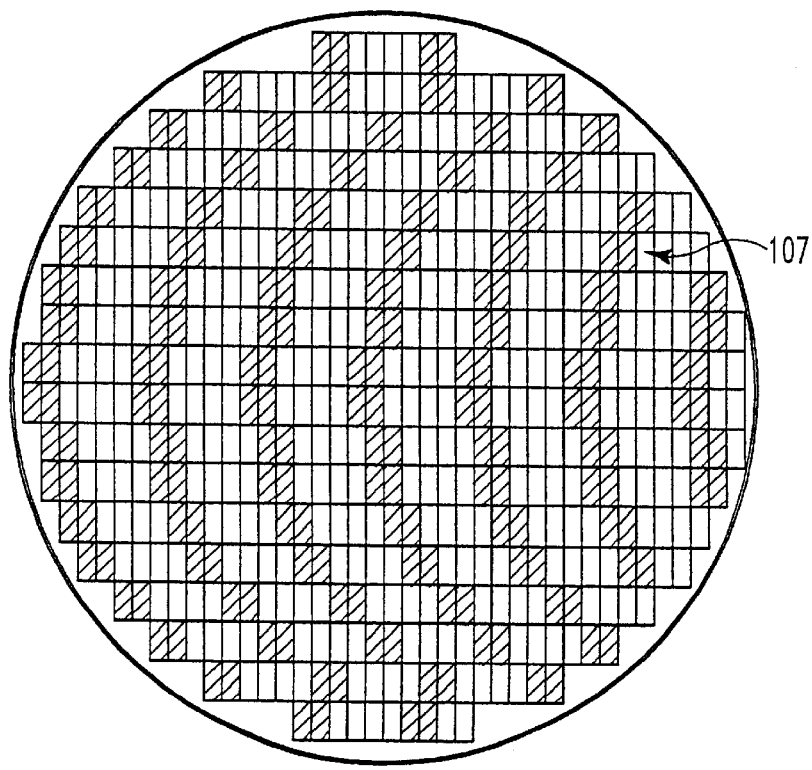
FIG. 10b shows probe contacts to a product water with a probes arranged in a double row of crescent shaped stripes all facing the same direction.
Figure 10C:
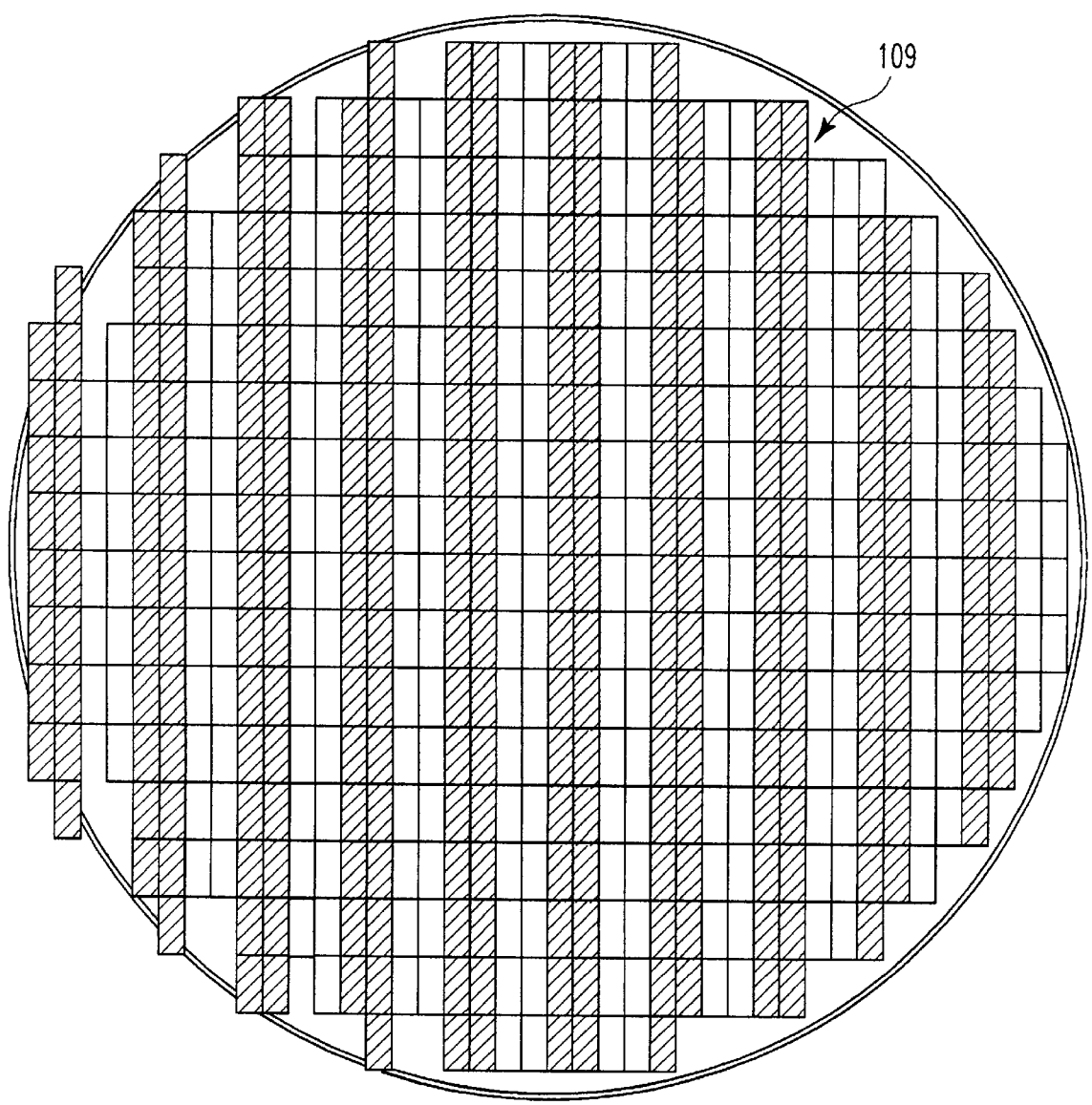
FIG. 10c shows probe contacts to a produce wafer with a probes arranged in a double row of straight line stripes.
Figure 11A:
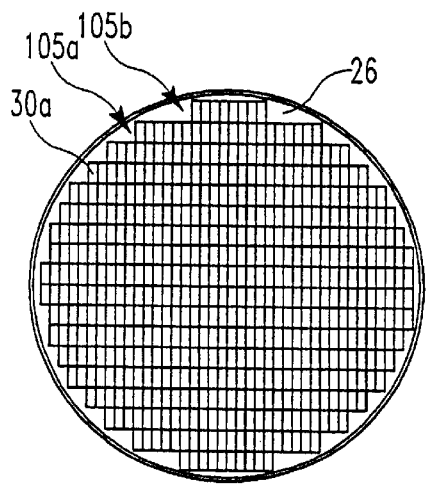
FIGS. 11a–11e show probe contacts to a product wafer as the product wafer is stepped one chip at a time beneath the probes, showing that all chips are tested and that some probes extend off the wafer.
Figure 11B:
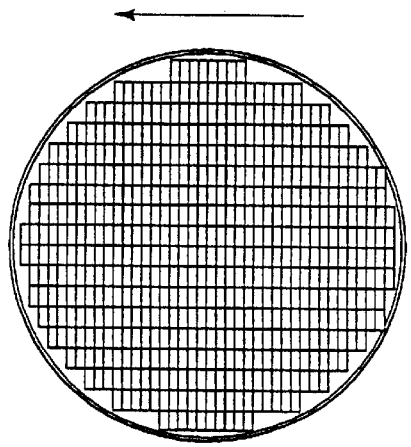
Figure 11C:
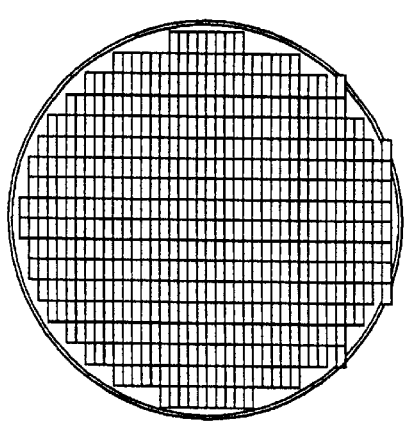
Figure 11D:
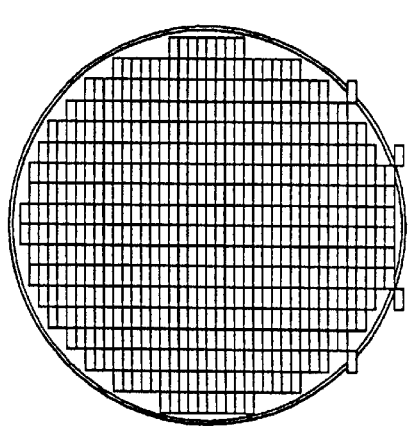
Figure 11E:
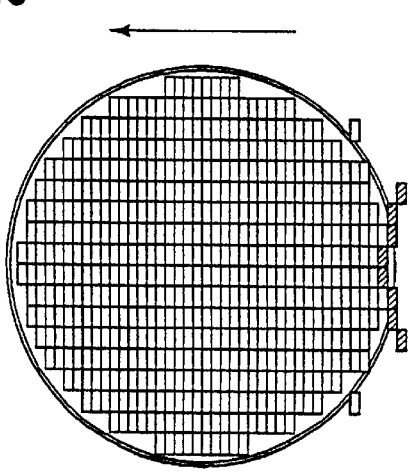

An alternate embodiment, in which all crescent test probe patterns face in the same, direction, is illustrated in FIGS. 10a–10b. Probes can be arranged in single width crescents 105 (FIG. 10a) or in a multiple width crescents, such as double crescents 107 (FIG. 10b) to probe two or more neighboring chips simultaneously. Providing crescents 105, 107 all facing in the same direction has advantage in that multiple probing of a single chip is avoided, saving probe pads from the possibility of damage from the multiple probing. This advantage comes at the expense of an increase in the number of probes that will extend off the wafer during probing, as shown in FIGS. 11a–11e, which can increase the probability of probe damage. The multiple rows can also be arranged in multiple straight line stripes 109, as shown with double stripes in FIG. 10c. For probing with multiple width crescents or stripes, the number of chips between probes should be a multiple of the probe width. For example, for double width crescents 107, 109 there should be an even number of untested chips between chips between being tested.

FIGS. 11a–11e show how an entire wafer can be probed in five steps without any chip being probed twice using a pattern with eight single crescents 105a–105h. It is evident that a similar result is also achievable by providing four double crescents. In the first probing step, test probe pattern 105a contacts first chip 30a in every row along one edge of wafer 26 while remaining test probe patterns 105b–105h contact respective chips on wafer 26. Although the left edge is used as the starting edge in FIG. 11a, the right edge, the top edge, or the bottom edge could equally be used. In the second probing step, wafer 26 is indexed one chip width so that test probe pattern 105b contacts second chip 30b in every row while remaining test probe patterns 105a–105h contacts respective chips adjacent the first chip tested. This indexing one chip width and testing sequence is repeated until all chips between test probe patterns are tested. In the case of FIGS. 11a–11e, the entire wafer can be tested in five testing steps. It is evident that the crescent shape selected is one that follows the precise die layout around the edge of circular wafer 26 being tested.

Three factors determine the number of steps, N, required to test an entire wafer: (a) the total number of chips on the wafer, n; (2) the number of tester channels, T; and (3) the number of chips sharing each tester channel, S. Thus, $$N = n/TS \text{ where } N \text{ is rounded to the next whole number}$$

Of course, this number of steps depends on the probes being arranged to contact a number of die equal to TS at each step. If the total number contacted in a step is greater than TS then an additional step is needed to reduce the number at that step. The following example illustrates the calculation of the number of steps required. The number of chips on the wafer, n=544. There are 128 tester channels and there is no sharing of tester channels. Thus the minimum number of steps is 544/128=4.25, which is rounded up to 5 steps. If each tester channel is shared by two chips then the minimum number of steps is 2.12, which is rounded up to 3 steps.

Figure 12:
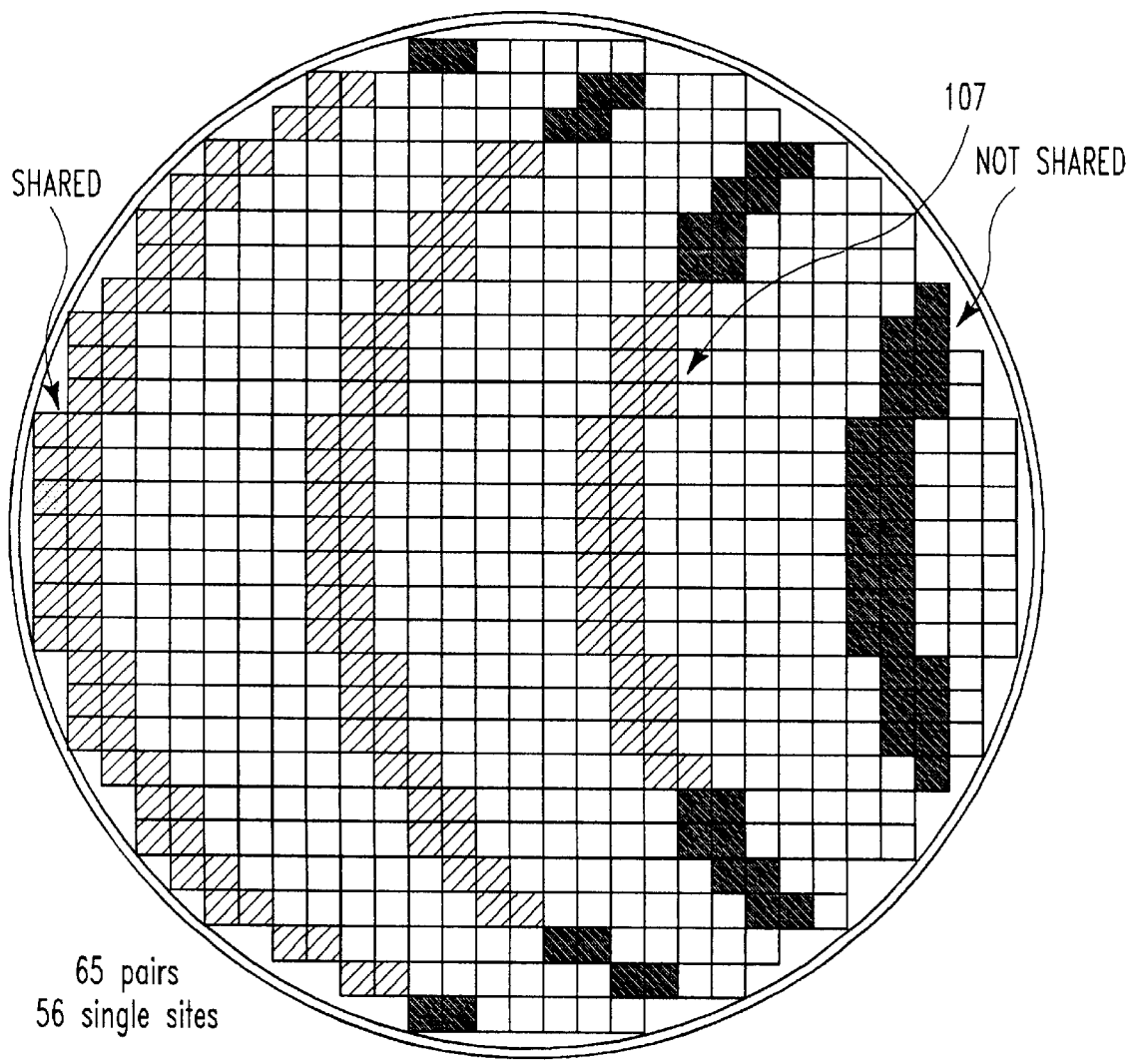
FIG. 12 shows probe contacts to a product wafer with a probes arranged in a double row of crescent shaped stripes all facing the same direction wherein some probes share tester channels and those probes that will extend off the wafer have their own tester channels to avoid shorting.

It is evident from FIGS. 11b–11e that probes extend off the edge of wafer 26 or beyond the last complete chip of wafer 26. This poses no electrical problem where each test probe is connected to its own set of tester channels. This also poses no electrical problem where test probes are shared except lot those probes that will extend off the wafer (or beyond the last complete chip of a wafer), as shown in FIG. 12. Grey test probes in each test probe pattern 107 share tester channels while black test probes each have their own individual tester channel. Alternatively, where all tester probes in each test probe pattern share tester channels provision is made to avoid shorting, such as by avoiding conductors on wafer 26 or on the supporting chuck beyond the edge of the chips to be tested. Restricting shared tester channels as shown in FIG. 12 has advantage over other techniques since test is now more independent of process and structures on the wafer. Thus, probes can be provided in multiple stripes or multiple crescents to obtain significant advantage in reducing the number of steps in systems where it is possible to share tester channels while avoiding shorting problems.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A test head, comprising:

a first board and a second board;

said first board having a probe side and a connection side, said probe side having probes for contacting at least one die on a product wafer, said connection side being adapted for electrical connections to said second board; and said second board having a contact side and a tester chip side, said contact side having contacts for electrical connection to said connection side of said first board, said tester chip side having a tester chip for distributing power to said die or for testing said die.

2. The test head as recited in claim 1, wherein said probes are for contacting substantially all the dies on the wafer.

3. The apparatus as recited in claim 1, wherein said first board comprises a material having a thermal coefficient of expansion matching that of the product wafer.

4. The apparatus as recited in claim 3, wherein said material comprises one of glass ceramic, aluminum nitride, Kovar, Invar, tungsten, and molybdenum.

5. The apparatus as recited in claim 1, wherein said second board comprises a material having a thermal coefficient of expansion matching that of the product wafer.

6. The test head as recited in claim 1, wherein said second board has a plurality of said tester chips.

7. The test head as recited in claim 1, wherein said first board comprises a material having a thermal coefficient of expansion matching that of the product wafer, said first board comprises a base and a thin film layer for personalizing said first board for contacting the die, said base being generic, said first board being tiled, all individual tiles of said first board being identical, said test head further comprising an interposer between said first board and said second board, said interposer comprising a housing mounted in a frame.

8. The test head as recited in claim 1, further comprising thermal resistance between said first and second board.

9. The test head as recited in claim 8, wherein said thermal resistance comprises a space between said first and second board, air providing said thermal resistance.

10. The test head as recited in claim 8, wherein said thermal resistance comprises a thermally resistant material between said first and second board.

11. The test head as recited in claim 10, wherein said thermally resistant material comprises an interposer between said first and second board.

12. The test head as recited in claim 8, wherein said thermal resistance comprises air or vacuum between said first and second board.

13. The test head as recited in claim 1, wherein said first board comprised a base and a thin film layer for personalizing said first board for contacting the die.

14. The test head as recited in claim 13, wherein said thin film layer comprises a plurality of conductive and insulating layers.

15. The test head as recited in claim 13, wherein said base is generic, personalization of said first board being exclusively in said thin film layer.

16. The test head as recited in claim 1, wherein said first board is tiled.

17. The test head as recited in claim 16, wherein all individual tiles of said first board are identical.

18. The test head as recited in claim 17, wherein said individual tiles are rotated with respect to each other.

19. The test head as recited in claim 1, further comprising a decoupling capacitor between side first board and said second board.

20. The test head as recited in claim 19, there being a plurality of power pads on said first board, wherein said decoupling capacitor is provided on each said power pad.

21. The test head as recited in claim 1, wherein said second board is usable for testing a family of product wafers.

22. The test head as recited in claim 1, wherein power from the power supply is distributed to said at least on tester chip through said second board.

23. The test head as recited in claim 1, wherein said tester chip comprises means for disconnecting contact to the power pads of a product chip.

24. The test as recited in claim 1, wherein said second board further comprises a plurality of contacts for connecting said test head to a tester.

25. The test head as recited in claim 1, further comprising an interposer between said first board and said second board.

26. The test head as recited in claim 25 wherein said interposer comprises housings mounted in a frame.

27. The test head as recited in claim 26 wherein housings comprise plastic, and said frame is thermally matched to said personalization board.

* * * * *

UNITED STATES PATENT AND TRADEMARK OFFICE
CERTIFICATE OF CORRECTION

PATENT NO. : 6,275,051 B1
DATED : August 14, 2001
INVENTOR(S) : Thomas W. Bachelder, Dennis R. Barringer, Dennis R. Conti, James M. Crafts, David L. Gardell, Paul M. Gaschke, Mark R. Laforce, Charles H. Perry, Roger R. Schmidt, Joseph J. Van Horn, Wade H. White It is certified that error appears in the above-identified patent and that said Letters Patent is hereby corrected as shown below:

<u>Title page,</u>
ABSTRACT, line 13, after "during" change "burning" to -- burn-in --.

<u>Column 3,</u>
Line 51, before "wafer" change "produce" to -- product --;

<u>Column 10,</u>
Line 3, at the beginning of the sentence, change "N=n/TS" to -- $N = \frac{n}{TS}$ --.

<u>Column 11, claim 13,</u>
Line 31, after "board" change "comprised" to -- comprises --.

<u>Column 12, claim 22,</u>
Line 19, after "least" change "on" to -- one --.

Signed and Sealed this

Second Day of April, 2002

*Attest:*

JAMES E. ROGAN
*Attesting Officer*        *Director of the United States Patent and Trademark Office*